(12) United States Patent
Nakata et al.

(10) Patent No.: US 8,538,573 B2
(45) Date of Patent: Sep. 17, 2013

(54) VACUUM PROCESSING APPARATUS AND PROGRAM

(75) Inventors: Teruo Nakata, Yokohama (JP); Hideaki Kondo, Kudamatsu (JP); Susumu Tauchi, Shunan (JP); Keita Nogi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 408 days.

(21) Appl. No.: 13/021,888

(22) Filed: Feb. 7, 2011

(65) Prior Publication Data

US 2011/0218662 A1 Sep. 8, 2011

(30) Foreign Application Priority Data

Mar. 2, 2010 (JP) ................................ 2010-045519

(51) Int. Cl.
*G06F 19/00* (2011.01)

(52) U.S. Cl.
USPC .............................. 700/121; 700/21; 702/128

(58) Field of Classification Search
USPC ............. 700/121, 21, 108, 109, 110, 98, 112; 702/128, 185, 35; 251/335
See application file for complete search history.

(56) References Cited

U.S. PATENT DOCUMENTS

| | | | | |
|---|---|---|---|---|
| 5,571,336 A | * | 11/1996 | Wurzburger et al. | 134/2 |
| 5,766,360 A | * | 6/1998 | Sato et al. | 118/666 |
| 6,224,638 B1 | | 5/2001 | Jevtic et al. | |
| 6,941,185 B2 | * | 9/2005 | Nishihata et al. | 700/121 |
| 7,353,076 B2 | * | 4/2008 | Nagayasu et al. | 700/112 |
| 7,611,124 B2 | * | 11/2009 | Shindo | 251/355 |
| 2002/0133260 A1 | * | 9/2002 | Nishihata et al. | 700/121 |
| 2009/0053016 A1 | | 2/2009 | Van der Meulen | |

FOREIGN PATENT DOCUMENTS

| | | |
|---|---|---|
| JP | 10-189687 | 7/1998 |
| JP | 2007-511104 | 4/2007 |

* cited by examiner

*Primary Examiner* — Kidest Bahta
(74) *Attorney, Agent, or Firm* — Antonelli, Terry, Stout & Kraus, LLP.

(57) ABSTRACT

Provided is a method for controlling efficient transferring operations in a vacuum processing apparatus with a linear tool. In the apparatus, plural transferring robots are arranged in transferring mechanism units in which plural process chambers are connected with each other, and to-be-processed wafers are received and passed between plural transferring robots. As the transferring robots is far from the load lock, the number of transferring operations to the process chambers is set larger, the number of times of continuous transferring operations to the process chambers is set as small as possible, and an odd number of times of continuous transferring operations to buffer rooms is set, by a destination determination unit and operation control rules. Further, transferring operations are performed based on the destination determination unit and the operation control rules.

8 Claims, 20 Drawing Sheets

FIG. 7

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER TO BE TRANSFERRED TO PROCESS CHAMBER 205 IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| TRANSFERRING FROM LOAD LOCK 211 TO BUFFER ROOM 212 | UNPROCESSED WAFER TO BE CARRIED TO OTHER THAN PROCESS CHAMBERS 205 AND 206 IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| TRANSFERRING FROM PROCESS CHAMBER 205 TO LOAD LOCK 211 | PROCESSED WAFER IS PRESENT IN PROCESS CHAMBER 205 |
| | AVAILABLE STAGE IS PRESENT IN LOAD LOCK 211 AND LOAD LOCK 211 IS IN VACUUM STATUS |
| | AT LEAST ONE HAND OF VACUUM ROBOT 217 IS IN STANDBY STATUS |
| ... | ... |

FIG. 9

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| | THE NUMBER OF UNPROCESSED WAFERS IN BUFFER ROOM 212 IS LARGER THAN THAT IN LOAD LOCK 211 |
| TRANSFERRING FROM LOAD LOCK 211 TO BUFFER ROOM 212 | UNPROCESSED WAFER IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| TRANSFERRING FROM BUFFER ROOM 212 TO PROCESS CHAMBER 207 | PROCESSED WAFER IS PRESENT IN BUFFER ROOM 212 |
| | PROCESS CHAMBER 207 IS IN STANDBY STATUS |
| | AT LEAST ONE HAND OF VACUUM ROBOT 218 IS IN STANDBY STATUS |
| | THE NUMBER OF UNPROCESSED WAFERS IN BUFFER ROOM 213 IS LARGER THAN THAT IN BUFFER ROOM 212 |
| TRANSFERRING FROM BUFFER ROOM 212 TO BUFFER ROOM 213 | UNPROCESSED WAFER IS PRESENT IN BUFFER ROOM 212 |
| | AVAILABLE STAGE IS PRESENT IN BUFFER ROOM 213 |
| | AT LEAST ONE HAND OF VACUUM ROBOT 218 IS IN STANDBY STATUS |
| ... | ... |

FIG. 11

| OPERATION INSTRUCTION | OPERATION INSTRUCTION CONDITION |
|---|---|
| TRANSFERRING FROM LOAD LOCK 211 TO PROCESS CHAMBER 205 | UNPROCESSED WAFER IS PRESENT IN LOAD LOCK 211 AND LOAD LOCK 211 IS IN VACUUM STATUS |
| | PROCESS CHAMBER 205 IS IN STANDBY STATUS |
| | AT LEAST ONE HAND OF VACUUM ROBOT 217 IS IN STANDBY STATUS |
| | THE NUMBER OF TIMES OF TRANSFERRING OPERATIONS OF VACUUM ROBOT 217 TO BUFFER ROOM IS ODD NUMBERS |
| TRANSFERRING FROM LOAD LOCK 211 TO BUFFER ROOM 212 | UNPROCESSED WAFER IS PRESENT IN LOAD LOCK 211 AND LOAD LOCK 211 IS IN VACUUM STATUS |
| | AVAILABLE STAGE IS PRESENT IN BUFFER ROOM 212 |
| | AT LEAST ONE HAND OF VACUUM ROBOT 217 IS IN STANDBY STATUS |
| | DESTINATION OF VACUUM ROBOT 217 TO BUFFER ROOM IS EVEN NUMBER |
| TRANSFERRING FROM BUFFER ROOM 212 TO PROCESS CHAMBER 207 | PROCESSED WAFER IS PRESENT IN BUFFER ROOM 212 |
| | PROCESS CHAMBER 207 IS IN STANDBY STATUS |
| | AT LEAST ONE HAND OF VACUUM ROBOT 218 IS IN STANDBY STATUS |
| | THE NUMBER OF TIMES OF TRANSFERRING OPERATIONS OF VACUUM ROBOT 218 TO BUFFER ROOM IS ODD NUMBERS |
| TRANSFERRING FROM BUFFER ROOM 212 TO BUFFER ROOM 213 | UNPROCESSED WAFER IS PRESENT IN BUFFER ROOM 212 |
| | AVAILABLE STAGE IS PRESENT IN BUFFER ROOM 213 |
| | AT LEAST ONE HAND OF VACUUM ROBOT 218 IS IN STANDBY STATUS |
| | DESTINATION OF VACUUM ROBOT 217 TO BUFFER ROOM IS EVEN NUMBER |
| ... | ... |

FIG. 13

| SITE | STATUS | WAFER NUMBER | WAFER STATUS |
|---|---|---|---|
| FOUP 201_STAGE 1 | — | W1 | PROCESSED |
| FOUP 201_STAGE 2 | — | EMPTY | — |
| ⋮ | ⋮ | ⋮ | ⋮ |
| FOUP 201_STAGE 25 | — | W25 | UNPROCESSED |
| FOUP 202_STAGE 1 | — | W26 | UNPROCESSED |
| ⋮ | ⋮ | ⋮ | ⋮ |
| FOUP 202_STAGE 25 | — | W50 | UNPROCESSED |
| ATMOSPHERIC ROBOT 203 | BEING CARRIED | W12 | UNPROCESSED |
| LOAD LOCK 211_STAGE 1 | VACUUM | W11 | UNPROCESSED |
| ⋮ | ⋮ | ⋮ | ⋮ |
| LOAD LOCK 211_STAGE 5 | VACUUM | W2 | PROCESSED |
| PROCESS CHAMBER 205 | BEING PROCESSED | W5 | BEING PROCESSED |
| PROCESS CHAMBER 206 | CLEANING | EMPTY | — |
| ⋮ | ⋮ | ⋮ | ⋮ |
| PROCESS CHAMBER 210 | STANDBY | EMPTY | — |
| VACUUM ROBOT 217_HAND 1 | STANDBY | EMPTY | — |
| VACUUM ROBOT 217_HAND 2 | BEING CARRIED | W3 | PROCESSED |
| VACUUM ROBOT 218_HAND 1 | BEING CARRIED | W8 | UNPROCESSED |
| VACUUM ROBOT 218_HAND 2 | BEING CARRIED | W7 | UNPROCESSED |
| VACUUM ROBOT 219_HAND 1 | STANDBY | EMPTY | — |
| VACUUM ROBOT 219_HAND 2 | STANDBY | EMPTY | — |
| BUFFER ROOM 212_STAGE 1 | — | W4 | PROCESSED |
| ⋮ | ⋮ | ⋮ | ⋮ |
| BUFFER ROOM 212_STAGE 5 | — | EMPTY | — |
| BUFFER ROOM 213_STAGE 1 | — | W6 | UNPROCESSED |
| ⋮ | ⋮ | ⋮ | ⋮ |
| BUFFER ROOM 213_STAGE 5 | — | EMPTY | — |

FIG. 14

| SITE IN CHARGE OF CARRYING | TRANSFER-RING TARGET | SENDER | DESTINATION |
|---|---|---|---|
| HAND 1 OF VACUUM ROBOT 217 | W10 | LOAD LOCK 211_STAGE 1 | BUFFER ROOM 212_STAGE 5 |
| HAND 1 OF VACUUM ROBOT 219 | W6 | BUFFER ROOM 213_STAGE 1 | PROCESS CHAMBER 210 |

FIG. 15

| WAFER NUMBER | DESTINATION |
|---|---|
| W1 | PROCESS CHAMBER 205 |
| W2 | PROCESS CHAMBER 207 |
| W3 | PROCESS CHAMBER 206 |
| W4 | PROCESS CHAMBER 209 |
| W5 | PROCESS CHAMBER 205 |
| W6 | PROCESS CHAMBER 208 |
| W7 | PROCESS CHAMBER 206 |
| . | . |
| . | . |
| . | . |
| W22 | PROCESS CHAMBER 210 |
| W23 | PROCESS CHAMBER 209 |
| W24 | PROCESS CHAMBER 210 |
| W25 | PROCESS CHAMBER 209 |

FIG. 16

| OPERATION ORDER | SITE | OPERATION |
|---|---|---|
| 1 | LOAD LOCK 211 | OPEN VACUUM-SIDE GATE VALVE 221 |
| 1 | VACUUM ROBOT 217 | PIVOT TO FACE THE DIRECTION OF LOAD LOCK 211 |
| 2 | VACUUM ROBOT 217 | TAKE WAFER OUT OF LOAD LOCK 211 |
| 3 | VACUUM ROBOT 217 | PIVOT TO FACE THE DIRECTION OF BUFFER ROOM 212 |
| 3 | BUFFER ROOM 212 | OPEN GATE VALVE 224 ON THE SIDE OF TRANSPORT CHAMBER 214 |
| 3 | LOAD LOCK 211 | CLOSE VACUUM-SIDE GATE VALVE 221 |
| 4 | VACUUM ROBOT 217 | PLACE WAFER IN BUFFER ROOM 212 |
| 5 | BUFFER ROOM 212 | CLOSE GATE VALVE 224 ON THE SIDE OF TRANSPORT CHAMBER 214 |

FIG. 17

| WAFER NUMBER | PROCESSING TIME |
|---|---|
| W1 | 40 |
| W2 | 40 |
| W3 | 40 |
| W4 | 40 |
| W5 | 40 |
| W6 | 40 |
| W7 | 40 |
| . | . |
| . | . |
| . | . |
| W22 | 40 |
| W23 | 40 |
| W24 | 40 |
| W25 | 40 |

FIG. 18

| CONNECTION SITE 1 | CONNECTION SITE 2 |
|---|---|
| ATMOSPHERIC-SIDE BLOCK 232 | LOAD LOCK 211 |
| LOAD LOCK 211 | TRANSPORT CHAMBER 214 |
| TRANSPORT CHAMBER 214 | BUFFER ROOM 212 |
| TRANSPORT CHAMBER 214 | PROCESS CHAMBER 205 |
| TRANSPORT CHAMBER 214 | PROCESS CHAMBER 206 |
| BUFFER ROOM 212 | TRANSPORT CHAMBER 215 |
| TRANSPORT CHAMBER 215 | BUFFER ROOM 213 |
| TRANSPORT CHAMBER 215 | PROCESS CHAMBER 207 |
| TRANSPORT CHAMBER 215 | PROCESS CHAMBER 208 |
| BUFFER ROOM 213 | TRANSPORT CHAMBER 216 |
| TRANSPORT CHAMBER 216 | PROCESS CHAMBER 209 |
| TRANSPORT CHAMBER 216 | PROCESS CHAMBER 210 |

FIG. 19

| TRANSFERRING ROBOT | ARRANGED SITE | ROBOT TYPE |
|---|---|---|
| ATMOSPHERIC ROBOT 203 | ATMOSPHERIC-SIDE BLOCK 232 | TYPE A |
| VACUUM ROBOT 217 | TRANSPORT CHAMBER 214 | TYPE B |
| VACUUM ROBOT 218 | TRANSPORT CHAMBER 215 | TYPE B |
| VACUUM ROBOT 219 | TRANSPORT CHAMBER 216 | TYPE B |

FIG. 20

| ROBOT | NUMBER OF TIMES OF TRANSFERRING OPERATIONS |
|---|---|
| VACUUM ROBOT 217 | 0 |
| VACUUM ROBOT 218 | 2 |
| VACUUM ROBOT 219 | 0 |

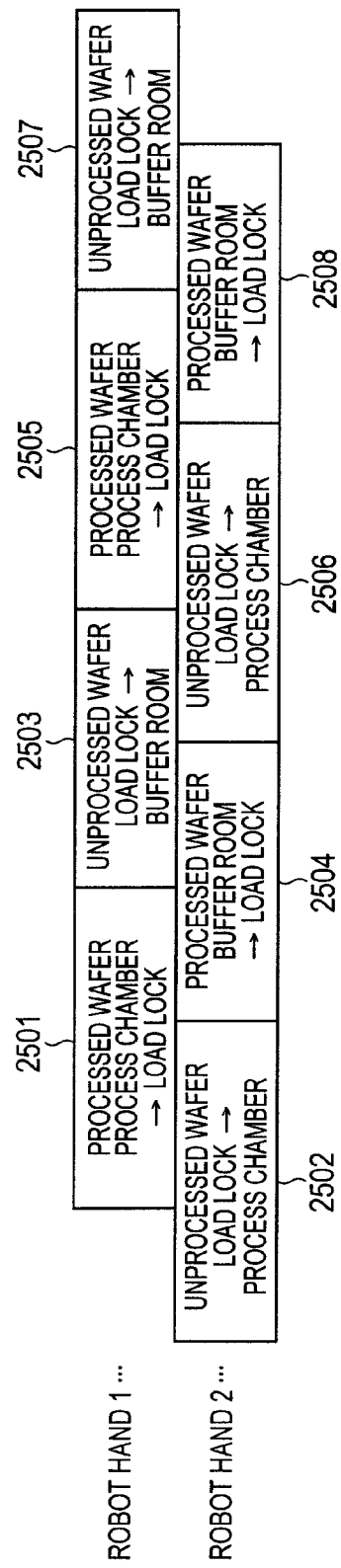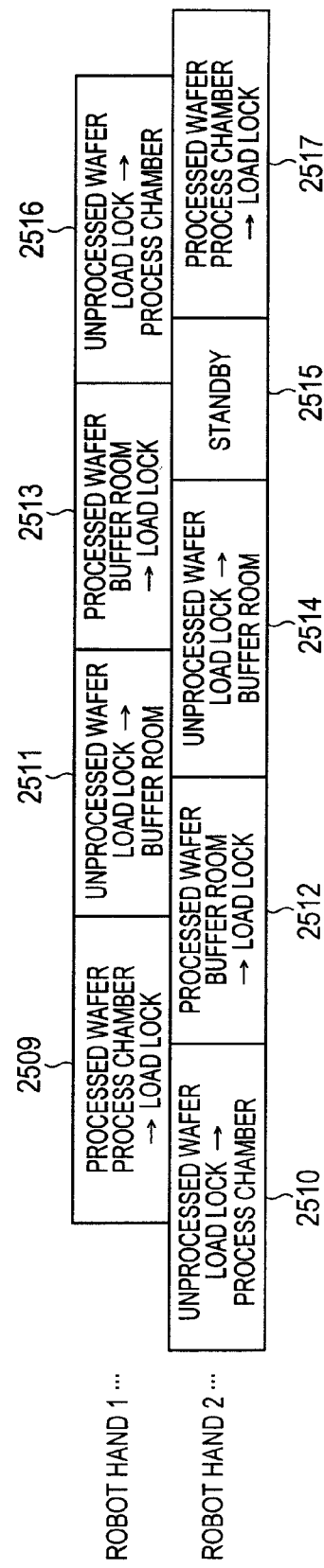

VACUUM PROCESSING APPARATUS AND PROGRAM

CLAIM OF PRIORITY

The present application claims priority from Japanese patent application JP 2010-045519 filed on Mar. 2, 2010, the content of which is hereby incorporated by reference into this application.

BACKGROUND OF THE INVENTION

1. Field of the Invention

The present invention relates to a method for transferring semiconductor objects to be processed (hereinafter referred to as "wafers") between process chambers of a semiconductor processing apparatus.

2. Description of the Related Art

Along with process miniaturization and precision, demand for improvement of the process efficiency for wafers to be processed is also increasing in semiconductor processing apparatuses. In particular, such apparatuses process targets to be processed therein, in which the pressure is reduced. Thus, in recent years, multi-chamber apparatuses have been developed. In the multi-chamber apparatuses, plural process chambers are connected with each other in a single apparatus. The productivity per installation space of the clean room has efficiently been improved. In the apparatuses that include plural process chambers for performing processing, the internal gas or the pressure in each process chamber can adjustably be reduced, and each process chamber is connected to a transport chamber(s) having a robot for transferring wafers.

As the multi-chamber apparatuses, apparatuses having a cluster tool configuration are spreading widely. In the configuration, process chambers are connected radially around the transport chamber. A problem of the cluster tool apparatuses is that they require a large installation space. Particularly, as the recent wafers have a large diameter, the apparatuses require a large installation space. To solve this problem, a new apparatus has a configuration called a linear tool (see Japanese Unexamined Patent Application Publication No. 2007-511104). As the feature of the linear tool, there are plural transport chambers to each of which a process chamber is connected. Further, the transport chambers are connected with each other directly or through a space (hereinafter referred to as an "buffer room") for receiving and passing the object in between.

Accordingly, the configuration of the linear tool has been proposed for lowering the installation space. On the contrary, some techniques have still been proposed for improving the productivity. For productivity improvement, some important factors are a reduction in the processing period and transferring efficiencies. Particularly, several proposals have been made as a transferring method with high efficiency. A typical transferring method uses a scheduling technique. According to the method with the scheduling, transferring operations are performed based on transferring operations which have been set in advance. In one example of determining the transferring operations, according to a proposed method, process chambers will be assigned as destinations in the order starting from the process completion time (see Japanese Patent Application Laid-Open Publication No. 10-189687).

SUMMARY OF THE INVENTION

The above-described techniques have some problems as follows.

The linear tool has plural transport chambers, each of which performs the transferring operations to the process chamber(s) and receives and passes the object therebetween. In addition, as its feature, different numbers of transferring operations for wafers to the process chamber are performed between the transport chambers, depending on the transport chambers connected to the process chamber. This feature differs from that of transferring operations with the cluster tool.

However, the conventionally proposed efficient transferring methods correspond to the features of the transferring system with the cluster tool configuration. The conventional techniques do not consider the features of the transferring system with the above-described linear tool. Thus, even if the conventional techniques are applied to the linear tool, they are not really efficient transferring methods.

The efficiencies of the transferring method may differ in accordance with the wafer processing steps. In some processing step, processing is completed through only one processing step in a process chamber, while processing is performed for a few times to complete the whole process in another processing step. Further, the processing step may depend on the operational conditions. In an operation condition, one kind of wafers are continuously processed, while different kinds of wafers are parallelly processed in another operation condition.

Among the above conditions, in a frequently performed operation, the same kind of wafers are continuously processed in the processing step in which the processing is completed through only one processing step in a process chamber.

It is accordingly an object of the present invention to provide a method for efficient transferring operations in an operation for continuously processing the same kind of wafers, in a processing step for completely performing a process through only one processing step in a process chamber, using a linear tool. In this case, the "same kind of wafers" implies a group of wafers having substantially the same processing time.

A destination of a target wafer to be processed is calculated in advance in such a manner that the number of times of transferring operations to a process chamber by a robot in a transport chamber far from a load lock is larger than the number of times of transferring operations to a process chamber by a robot in a transport chamber near the load lock, and a transferring operation is executed based on a calculation result.

Further, provided are a unit which calculates the number of times of transferring operations to a process chamber by each transferring robot and a unit which allocates target wafers to process chambers. The calculation unit is to calculates a destination of each target wafer to be processed, in such a manner that the number of times of transferring operations to process chambers by a robot of a transport chamber far from a load lock is larger than the number of transferring operations to process chambers by a robot of a transport chamber close to the load lock.

Further, provided is a unit which calculates a connection distance between the load lock and the transport chamber, as a unit to calculates a destination of each target wafer to be processed, in such a manner that the number of times of transferring operations to process chambers by a robot of a transport chamber far from a load lock is larger than the number of transferring operations to process chambers by a robot of a transport chamber close to the load lock.

A transferring operation is executed based on a controlling rule for transferring wafers preferentially to a transport chamber or buffer room that is far from a load lock, when the number of unprocessed wafers in the transport chamber or buffer room far from the load lock is smaller than the number of unprocessed wafers in a transport chamber or buffer room near the load lock.

A destination of each wafer to be processed is calculated in advance in such a manner that the number of times of transferring operations continuously to the buffer room by a robot of each transport chamber is an odd number as much as possible. A transferring operation is executed based on the calculated destination.

Further, there is a unit that calculates a transferring order in which the number of times of continuous transferring operations to the buffer room is an odd number, as a unit that calculates a destination of each wafer to be processed in such a manner that the number of times of continuous transferring operations to the buffer room by a robot of each transport chamber is an odd number as much as possible.

A transferring operation is executed based on a controlling rule, using a counted number of times of continuous transferring operations to the buffer room of the robot in each transport chamber. In the controlling rule, if the number of times of continuous transferring operations to the buffer room by the robot of each transport chamber is an odd number, a destination of a next unprocessed wafer is a process chamber. In addition, if the number of continuous transferring operations to the buffer room by the robot of each transport chamber is an even number, a destination of a next unprocessed wafer is a buffer room.

According to the present invention, it is possible to provide a semiconductor processing apparatus, which can reduce the standby period of the robot(s) transferring wafers and achieve high transferring efficiencies and high throughput.

BRIEF DESCRIPTION OF THE DRAWINGS

Embodiments of the present invention will be described in detail based on the following figures, wherein:

FIG. 7 is a diagram showing an example of operation instruction rules in the first embodiment;

FIG. 9 is a diagram showing an example of instruction operation rules in the second embodiment;

FIG. 11 is a diagram showing an example of instruction operation rules in the third embodiment;

FIG. 13 is a diagram showing an example of apparatus status information;

FIG. 14 is a diagram showing an example of operation instruction information;

FIG. 15 is a diagram showing an example of destination information;

FIG. 16 is a diagram showing an example of operation sequence information;

FIG. 17 is a diagram showing an example of processing target information;

FIG. 18 is a diagram showing an example of site connection information;

FIG. 19 is a diagram showing an example of transferring robot information;

FIG. 20 is a diagram showing an example of information regarding the number of times of transferring operations;

FIG. 25A is a diagram for explaining an example of transferring efficiency in which one process chamber transferring and one buffer room transferring are alternately repeated; and FIG. 25B is a diagram for explaining an example of transferring efficiency in which a set of one transferring operation to a process chamber and two transferring operations to a buffer room(s) are repeated.

DETAILED DESCRIPTION OF THE INVENTION

Figure 1:
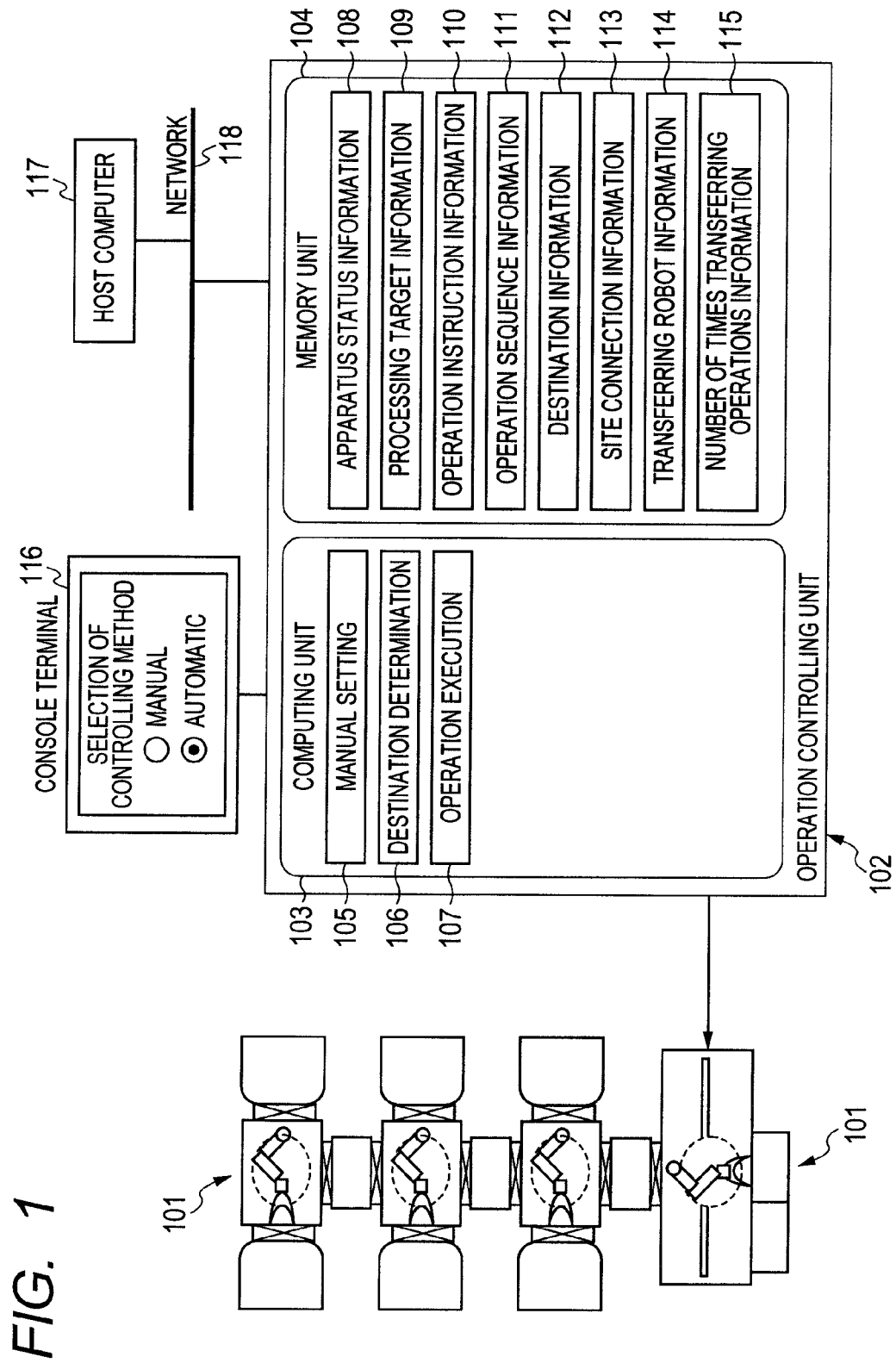
FIG. 1 is a diagram for explaining the scheme of the entire configuration of a semiconductor processing apparatus.

Embodiments of the present invention will now be described with reference to the accompanying drawings.

First Embodiment

A first embodiment of the present invention will now be described.

The scheme of the entire configuration of a semiconductor processing apparatus of the present invention will now be described using FIG. 1. Briefly, the semiconductor processing apparatus is composed of a process chamber/transferring mechanism 101, an operation controlling unit 102 and a console terminal 116. The process chamber/transferring mechanism 101 includes a process chamber and a transferring mechanism. The process chamber can perform various processes, such as a wafer etching process, a film formation process, and the like. The transferring mechanism includes a robot for transferring wafers. An operation controlling unit 102 controls operations of the process chamber/transferring mechanism. The unit 102 includes a computing unit 103 performing calculation processes and a memory unit 104 storing various information. The computing unit 103 includes a manual setting process 105, a destination determination process 106 and an operation execution process 107. The manual setting process 105 performs a calculation process at the time a user manually operates the process. The destination determination process 106 automatically determines the destination for wafers. The operation execution process 107 performs calculations for actually operating the process chamber/transferring mechanism. The memory unit 104 stores apparatus status information 108, processing target information 109, operation instruction information 110, operation sequence information 111, destination information 112, site connection information 113 and number of times transferring operations information 115. The console terminal 116 is provided for the user to input a control method and to ascertain the apparatus status. The console terminal 116 includes an input unit, such as a keyboard, a mouse and a touch pen, and a screen for outputting information. The semiconductor processing apparatus is connected to a host computer 117 through a network 118, and can download necessary information from the host computer 117 as needed.

Figure 2:
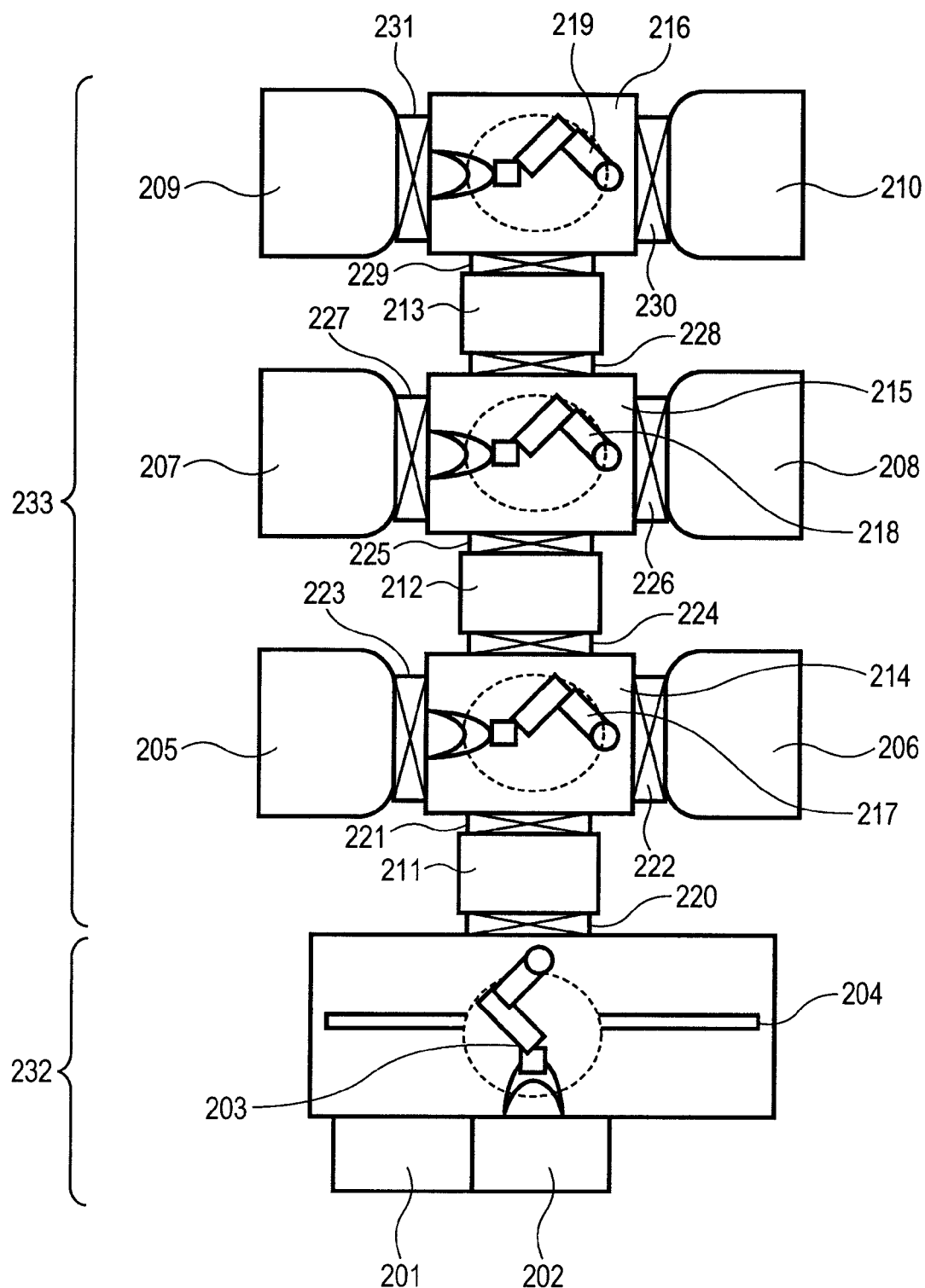
FIG. 2 is a diagram for explaining the configuration of a process chamber/transferring mechanism.

The configuration of the process chamber/transferring mechanism will now be described using FIG. 2. Briefly, the process chamber/transferring mechanism is composed of an atmosphere-side block 232 and a vacuum-side block 233. The atmosphere-side block 232 is provided for transferring wafers under atmospheric pressure, specifically for removing or housing wafer(s), from a cassette including wafers therein. The vacuum-side block 233 carries wafers under pressure reduced from atmospheric pressure, and performs processes in a vacuum chamber. A load lock 21 is provided between the atmosphere-side block 232 and the vacuum-side block 233. The load lock is to change the level of the pressure up or down between the atmospheric pressure and the vacuum pressure, while the wafers is included therein.

The atmosphere-side block 232 includes FOUP (Front-Opening Unified Pod)s 201 and 202 and an atmospheric robot 203. A cassette containing wafers to be processed is arranged on the FOUPs 201 and 202. The atmospheric robot 203 having a hand for keeping the wafers removes the wafer(s) contained inside the cassette, and carries the wafer into the load lock 211. Further, the atmospheric robot 203 removes the wafer from the load lock 211, and sets the wafer into the cassette. This atmospheric robot 203 can expand and contract, move up and down, and turn around its robot arm. Further, the atmospheric robot 203 can horizontally move above a rail 204. In this case, the atmosphere-side block 232 is only one example in this invention. The apparatus of the present invention is not limited to the apparatus having two loops, and the number of loops may be larger or smaller than two. In addition, the apparatus of the present invention is not limited to the apparatus having only one atmospheric robot, and my have plural atmospheric robots. Though it will not be described in this embodiment, the apparatus of the present invention may have a mechanism for determining the wafer position(s).

The vacuum side block 233 includes process chambers 205, 206, 207, 208, 209, 210, transport chambers 214, 215, 216, and buffer rooms 212 and 213. The process chambers 205, 206, 207, 208, 209 and 210 are sites for performing processes, such as a wafer etching process, a film formation process and the like. Such process chambers are connected to the transport chambers 214, 215, and 216, through respective gate valves 222, 223, 226, 227, 230, and 231. Each of the gate valves 222, 223, 226, 227, 230, 231 has a valve which opens and closes, divides the space inside the process chambers and the space inside the transport chambers, and also connects the spaces.

The transport chambers 214, 215, and 216 respectively include vacuum robots 217, 218, and 219. Each of the vacuum robots 217, 218, and 219 includes two robot hands enabling to keep the wafers. The robot arms can expand and contract, move up and down, and turn around. The robot arms carry the wafers to the load lock, the process chambers, and/or the buffer rooms.

The buffer rooms 212 and 213 intervene between the transport chambers 214, 215 and 216. Each of the chambers 212 and 213 includes a mechanism for keeping plural wafers. The vacuum robots 217, 218, and 219 put wafers into the buffer rooms 212 and 213 and remove the wafers therefrom, thereby transferring (receiving/passing) the wafers between the transport chambers. The buffer rooms 212 and 213 are connected to the transport chambers 214, 215, and 216 through the gate valves 224, 225, 228, and 229. Each of the gate valves 224, 225, 228, and 229 has a valve which opens and closes, divides the space inside the transport chamber and the space inside the buffer room, and also connects the spaces. The vacuum side block 233 is only one example of this invention. The apparatus of the present invention is not limited to the apparatus having six process chambers, and the number of the process chambers may be larger or smaller than six.

In this embodiment, the descriptions will be made to the apparatus in which two process chambers are connected to one transport chamber. However, the apparatus of the present invention is not limited to the apparatus having the two process chambers being connected to one transport chamber, and only one or three or more process chambers may be connected to the transport chamber. In addition, the apparatus of the present invention is not limited to the apparatus having three transport chambers, and the number of transport chambers is smaller or larger than three. In the present invention, the descriptions will be made to the apparatus having a gate valve provided between the transport chamber and the buffer room. However, this gate valve is not necessary.

The load lock 211 is connected to the atmosphere side block 232 and the vacuum-side block 233 respectively through the gate valves 220 and 221, and moves the level of the pressure up and down between the atmospheric pressure and the vacuum pressure, while the wafers are included therein. Note that the load lock 211 has a mechanism for keeping plural wafers.

Descriptions will be made onto the assumption of a processing step of completing the processing for a group of wafers in the process chamber. Further, the assumption is that the processing time of the wafers is short in the process chamber, that is, the time for transferring the wafers depends on the overall throughput of the semiconductor processing apparatus. Note that the group of wafers has substantially the same processing time.

Descriptions will now be made to a control system for efficiently performing the transferring. Note that the efficient transferring implies to efficiently use the robot performing the wafer transferring operations. That is, the transferring includes a transferring operation for reducing the standby period of the robot. Particularly, the linear tool has plural transport chambers, each of which includes a robot. If the standby period of all of the entire robots is reduced as much as possible, the efficiency can be improved.

The semiconductor processing apparatus is composed of the atmosphere-side block and the vacuum side block, which are connected to each other through the load lock transferring the wafers therebetween. As one feature of the linear tool, the transport chamber(s) may be adjacent to the load lock, or several different transport chambers may be provided between the transport chamber and the load lock. That is, there may be different connection relationship between the load lock and the transport chambers, depending on the transport chambers. In other words, some transport chamber is physically close to or far from the load lock.

This feature allows different transferring operations among the robots provided in the transport chambers. For example, when transferring wafers to a process chamber connected to a transport chamber near the load lock, the wafers will never be transferred to the transport chamber far from the load lock. Thus, the robot of the transport chamber far from the load lock will not carry the wafers. However, when transferring wafers to a process chamber connected to the transport chamber far from the load lock, the robot of the transport chamber near the load lock carries the wafers, because it passes the transport chamber near the load lock. Under such circumstances, the robot of the transport chamber near the load lock carries a larger number of wafers than those transferred by the robot of the transport chamber far from the load lock. That is, the robot of the transport chamber near the load lock is busier than the robot of the transport chamber far from the load lock. In other words, there is a longer standby period of the robot of the transport chamber far from the load lock than that of the robot in the transport chamber near the load lock.

Further, a longer period of time is required for transferring wafers to the process chamber than the period of time for transferring wafers from the transport chamber to the adjacent transport chamber. Based on this feature and the above-described feature that the longer standby period is required for the robot far from the load lock, a larger number of wafers should be transferred by the robot of the transport chamber far from the load lock, while a smaller number of wafers should be transferred by the robot of the transport chamber near the load lock. As a result, the entire robots can be equally busy, thus reducing the standby period.

Further, descriptions will now be made to another efficient transferring method.

The mainstream apparatus is one having two robot hands in the transport chamber. It is possible to improve the efficiencies, by reducing the standby period of the robot hands in the same transport chamber.

The two robot hands in the same transport chamber have briefly two different operations, which are a process chamber transferring and a buffer room transferring. The process chamber transferring includes an operation for removing processed wafers from the process chamber and an operation for putting unprocessed wafers into the process chamber. On the contrary, the buffer room transferring includes two operations, which are an operation for removing processed wafers from the buffer room and an operation for putting unprocessed wafers into the buffer room. These operations are shared between the two robot hands. To efficiently perform the operations, following two rules should be considered in performing the transferring operations.
(1) In the process chamber transferring, for the sake of efficiency, one of the two robot hands removes processed wafers, and immediately after this, it puts unprocessed wafers thereinto. Thus, when beginning the process chamber transferring, one of the robot hands keeps unprocessed wafers, while the other robot hand does not keep the wafer.
(2) For the sake of efficiency, right after processed wafers are put into the load lock, the same robot hand performs an operation for removing unprocessed wafers from the load lock. Thus, the robot puts the unprocessed wafers from "the load lock to the process chamber" or from "the load lock to the buffer room", after putting the processed wafers from "the process chamber to the load lock" or from "the buffer room to the load lock".

Detailed descriptions will now be made to an operation sequence wherein two robot hands perform the process chamber transferring and the buffer room transferring, using FIG. 25A and FIG. 25B.

FIG. 25A shows an example in which one process chamber transferring and one buffer room transferring are alternately repeated. As basic operations, while one of the two robot hands removes the processed wafer from the process chamber into the buffer room, the other robot puts the unprocessed wafer to the process chamber into the buffer room. In FIG. 25A, in an operation 2501, a robot hand 1 removes the processed wafer from the process chamber, and it puts it into the load lock. In an operation 2502, a robot hand 2 removes the unprocessed wafer from the load lock, and puts the wafer to the process chamber. The process chamber transferring is thus completed, by operations 2501 and 2502.

The operation 2502 begins before the operation 2501. For the state of rule (1) for efficiently performing the above-descried operations, the robot hand 2 performs an operation for removing the unprocessed wafer from the load lock, before the robot hand 1 performs an operation for removing the processed wafer. Thus, in the process chamber transferring, the operation for "removing the unprocessed wafer from the load lock to the process chamber" begins before the operation for "removing the processed wafer from the process chamber to the load lock".

In an operation 2503, the robot hand 1 removes the unprocessed wafer from the load lock and puts it into the buffer room, after operations 2501 and 2502 as operations for the process chamber transferring. In an operation 2504, the robot hand 2 removes the processed wafer from the buffer room, and puts it to the load lock. The buffer room transferring is completed, by the operations 2503 and 2504. Then, operations 2505 and 2506 are performed as operations for the process chamber transferring, and operations 2507 and 2508 are performed as operations for the buffer room transferring.

FIG. 25B shows an example in which a set of one process chamber transferring and two transferring operations to a buffer room are repeated. Like the example of FIG. 25A, operations 2509 and 2510 are performed as the process chamber transferring. Next, operations 2511 and 2512 are performed as the first buffer room transferring. Further, operations 2513 and 2514 are performed as the second buffer room transferring.

Unlike the example of FIG. 25A, the robot hand 2 has a standby status 2515 between operations 2516 and 2517 as the next process chamber transferring. This standby status 2515 inevitably occurs with consideration of the above-described two rules for efficient transferring. Focusing on the operations 2513 and 2514 for the second buffer room transferring, the process chamber transferring is performed after this buffer room transferring. Thus, it is necessary to have such a state that one of the robot hands keeps the unprocessed wafer, while the other robot hand does not keep any wafer. Since the unprocessed wafer is removed from the load lock, the robot hand 1 is to remove the unprocessed wafer from the load lock. This robot hand 1 has performed the operation 2513 as an operation for putting the processed wafer into the load lock. Thus, after the operation 2514, the robot hand 2 is in a standby status 2514 before the operation for removing the processed wafer from the process chamber.

In the example of FIG. 25A, the buffer room transferring is performed once. In the example of FIG. 25B, the buffer room transferring is performed twice. If the buffer room transferring is performed once, the robot hand performing the operation for putting the processed wafer into the load lock is switched from one to another. Thus, when an odd number of times the buffer room transferring is performed, the standby status does not occur, like the example of FIG. 25A. When an even number of times the buffer room transferring is performed, the standby status occurs, like the example of FIG. 25B. Accordingly, when an odd number of times the buffer room transferring is continuously performed, the standby status is shorter than the case, in which the even number of times the buffer room transferring is performed.

To realize the transferring method for realizing the above, it is necessary to consider its control system in the form of an apparatus. There are briefly two different kinds of control systems.

The first control system is a scheduling system. In this system, a transferring operation is set in advance, and the actual transferring operation is performed based on the set transferring operation. For example, the destination process chambers are set in advance respectively for target wafers to be processed, and the transferring operation is performed based on the set information.

The second control system is an event-driven system. The target process chamber is not set in advance. Depending on the state in the apparatus, the transferring operation is performed based on judgment of the state. One feature of this even-driven system is a control rule for judging the state.

In the first embodiment, descriptions will now be made to an apparatus for controlling the scheduling system, by way of example. For efficient transferring using the apparatus having the scheduling system, the number of times the transferring is performed by a robot in a transport chamber far from the load lock is set larger than the number of times the transferring is performed by a robot in a transport chamber near the load lock. Further, such a transferring operation is calculated in advance such that the odd number of times transferring operations to the buffer room is continuously performed by the robot of each transport chamber as much as possible. Then, the transferring operation is performed based on the calculated operation.

Figure 3:
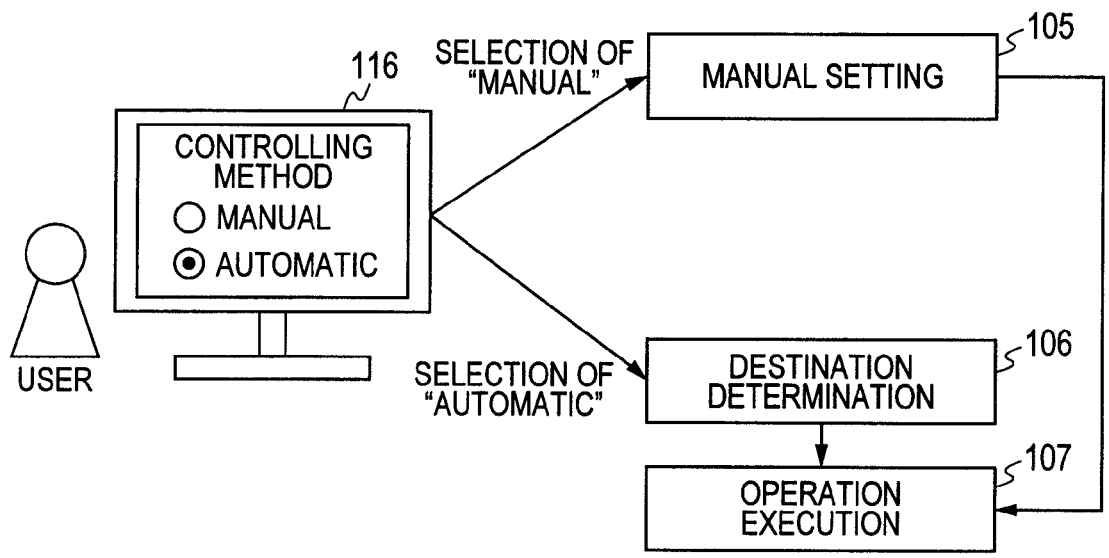
FIG. 3 is a diagram for explaining the scheme of a system for controlling operations of the semiconductor processing apparatus.

Descriptions will now be made to the scheme of a system for controlling operations of the semiconductor processing apparatus of the present invention, using FIG. 3. There are two control methods. One of the methods is for the user to manually operate the apparatus, and the other method is an automatic operation method. Mainly, the manual control operation is applied for the maintenance purpose or in urgency, while the automatic operation is applied in normal production. These methods are switched from one to another upon user selection through the console terminal 116. When the manual control method is selected through the console terminal 116, a manual process routine is performed. In the manual setting process 105, the user selects a target wafer to be transferred through the console terminal 116. When the user sets the destination, an operation instruction is generated in accordance with the set destination. An operation is performed in the operation execution process 107, based on the instruction. On the contrary, when the user selects the automatic control method, an automatic process routine is performed. In the destination determination process 106, the process chamber of the destination of each wafer is automatically calculated, and the operation execution process 107 is performed based on the calculation.

Descriptions will now be made to the feature of the present invention, that is, an automatic process routine.

Figure 4:
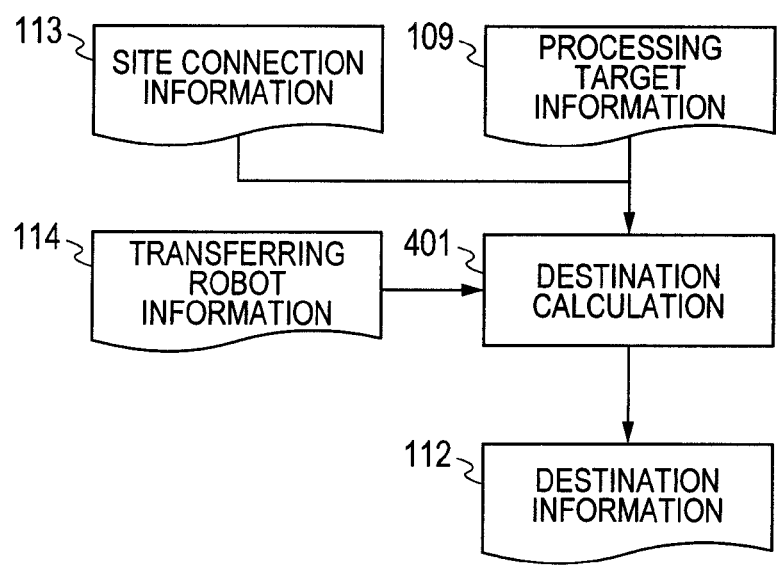
FIG. 4 is a diagram for explaining the scheme of a destination determination process.

Descriptions will now be made to the scheme of the destination determination process 106 using FIG. 4. This destination determination process 106 is executed, when a new cassette arrives at the FOUP 201 or 202. In this process, the site connection information 113, transferring robot information 114, and processing target information 109 are input. Destination calculation 401 is performed, and the destination information 112 is generated. The site connection information 113 is one exemplarily shown in FIG. 18, and represents the connection relationship among the transport chamber, the process chamber, the load lock, the buffer room, and the atmosphere side block. The transferring robot information 114 represents the site in which the transferring robot is arranged and the kind of robot. The processing target information 109 is information regarding each wafer contained in the cassette put on the FOUP 201 or 202. When the cassette is put on the FOUP, the contained wafer is scanned. Information regarding the scanned wafer is sent to a host computer. Recipe representing "processing conditions" of each wafer is downloaded from the host computer. In this case, the processing conditions include, for example, the processing period, temperature, gas concentration, or the like. The processing target information 109 exemplarily shown in FIG. 17 keeps information regarding wafer numbers and corresponding wafer processing times, in association with each other. The destination information 112 is exemplarily shown in FIG. 15, and represents the destination process chamber for each wafer.

Figure 5:
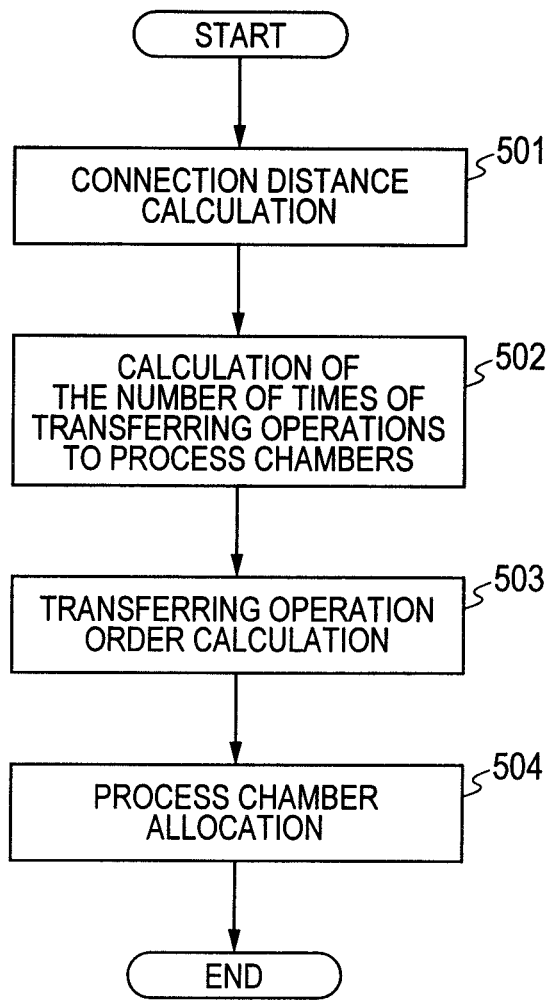
FIG. 5 is a diagram for explaining a calculation procedure for calculating the destination in the first embodiment.

Descriptions will now specifically be made to a calculation procedure in the destination calculation 401, using FIG. 5. This calculation includes connection distance calculation 501, calculation of the number of times of transferring operations to process chambers 502, transferring order calculation 503, and process chamber allocation 504.

Figure 21:
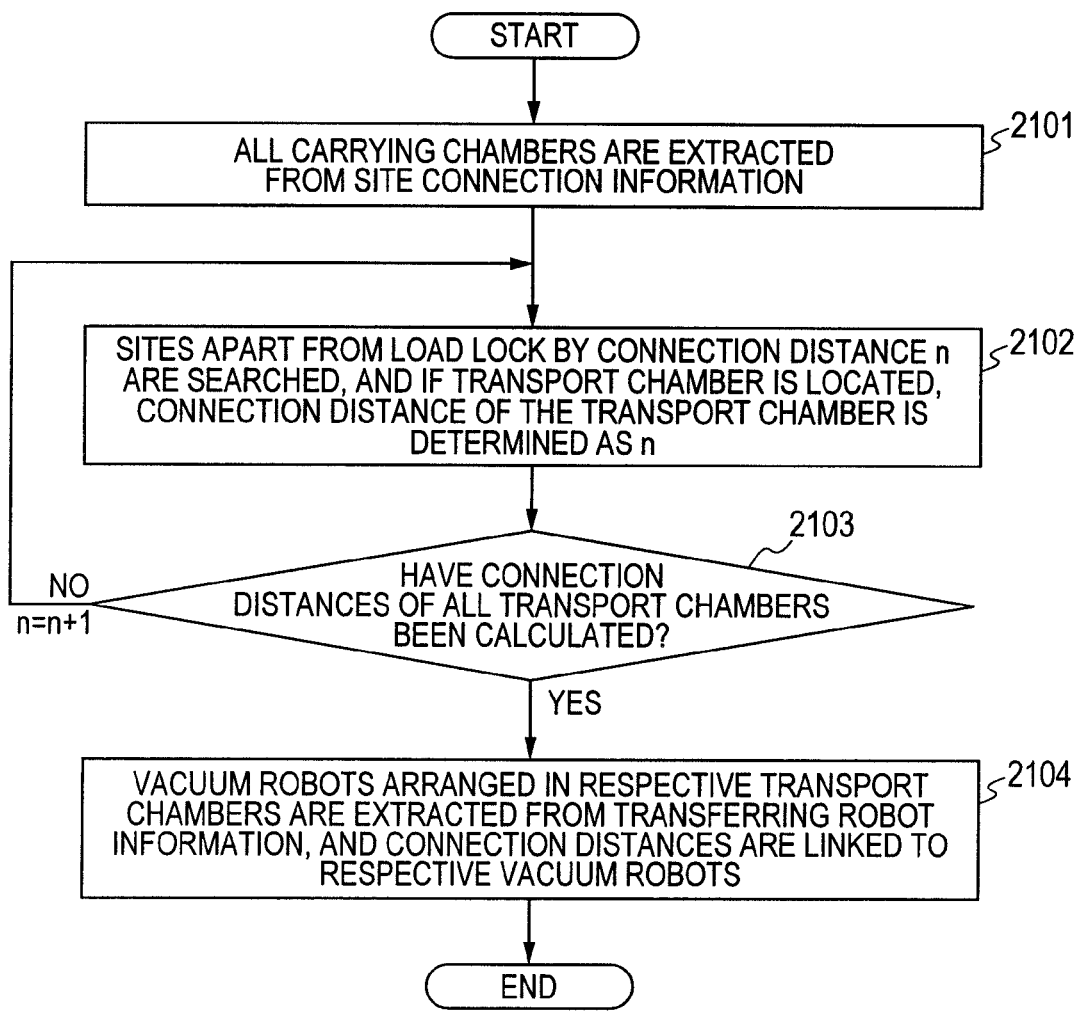
FIG. 21 is a diagram showing a flowchart of a connection distance calculation process.

Descriptions will now be made to the connection distance calculation 401 using the flowchart of FIG. 21. In this case, the "connection distance" implies the distance in the connection relationship to the load lock 211 of each connection site. In step 2101, information regarding the entire transport chambers corresponding to the "connection site 1" is extracted from the site connection information 113. The site connection information 113 is exemplarily shown in FIG. 18, and represents the connection relationship between the transport chambers, the process chambers, the load lock, and the buffer rooms. In the example of FIG. 18, information regarding the transport chambers 214, 215 and 216 are extracted.

Figure 23:
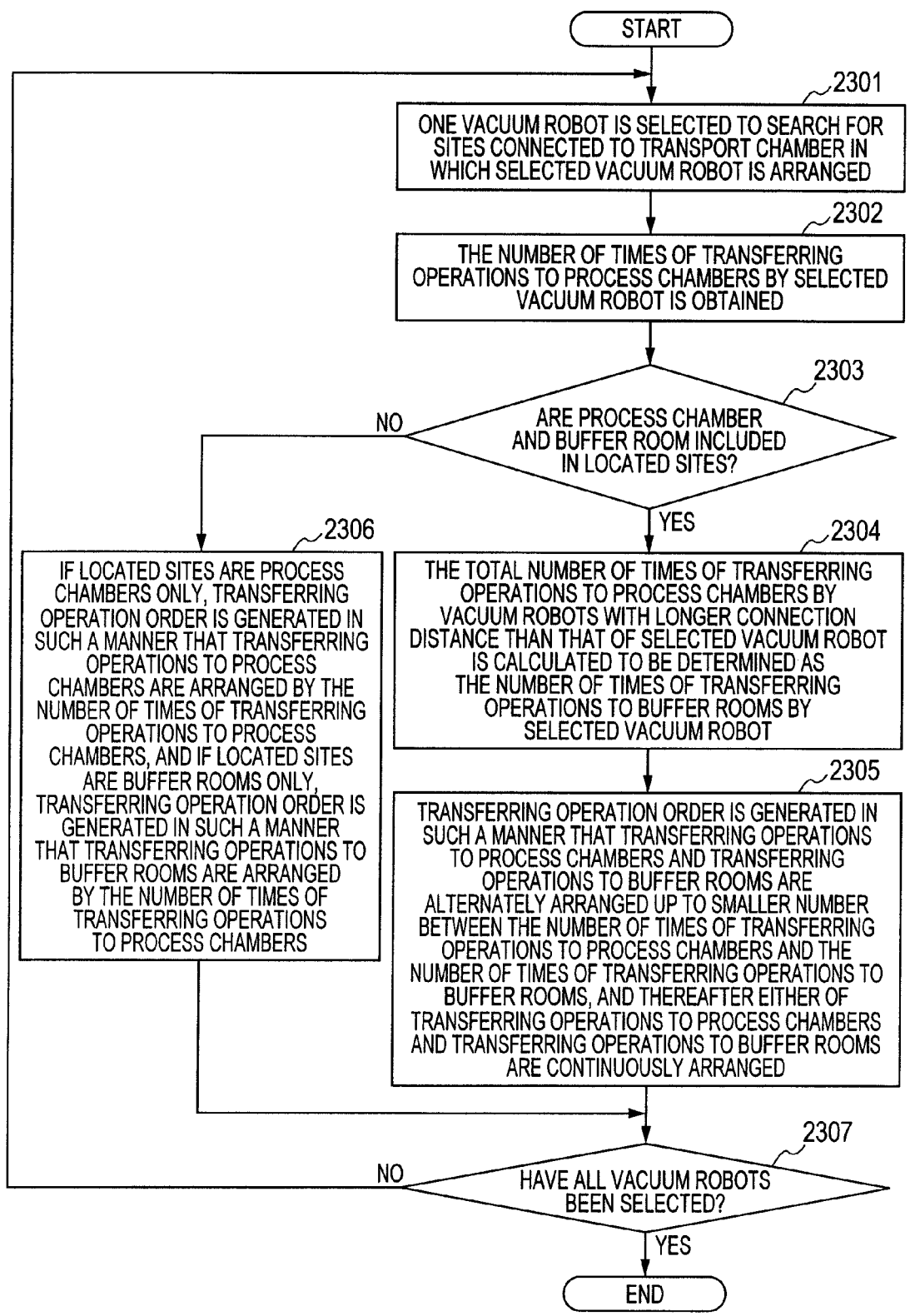
FIG. 23 is a diagram showing a flowchart of a process for calculating a transferring operation order.

In step 2102, the site connection information 113 is used for searching for a site having a connection distance "n" to the load lock 211. If the searched site is the transport chamber extracted in step 2101, the connection distance of the transport chamber is set to "n". The site whose connection distance is "n" can be successfully obtained, by searching for a site with the connection distance "n−1" from the "connection site 1" of the site connection information 113, and acquiring a site(s) corresponding to the "connection site 2" of the data. First, the initial state is that n=1. When n=1, the load lock 211 is searched from the "connection site 1" of the site connection information 113. Then, the site of the "connection site 1" is obtained by extracting its connection site 2. In the example of FIG. 23, the transport chamber 214 has a connection distance 1.

In step 2103, a determination is made as to whether the connection distances corresponding to the entire transport chambers extracted in step 2101 have been calculated. If the connection distances of the entire transport chambers have been calculated, the flow advances to step 2104. If the connection distances of the entire transport chambers have not been calculated yet, the connection distance of "n=n+1" is set, and the flow repeats step 2102. In the example of FIG. 18, the site of the connection distance 2 will now be searched. The transport chamber 214 having the connection distance 1 is searched from the "connection site 1" of the site connection information 113, and information regarding its corresponding connection site 2 is extracted therefrom. If the connection site 2 is the extracted transport chamber, the transport chamber has the "connection distance 2". In this example, the sites having the "connection distance 2" include the buffer room 212, the process chambers 205 and 206, and do not include any transport chamber. Sites having a connection distance 3 will now be searched. The buffer room 212, the process chambers 205 and 206 having the "connection distance 2" are searched from the "connection site 1" of the site connection information 113, and information regarding their connection sites 2 are extracted. The process chambers 205 and 206 do not correspond to the "connection site 1". Thus, information regarding only the buffer room 212 is extracted, and its corresponding "connection site 2" is the transport chamber 215. Thus, the transport chamber 215 has the connection distance 3. In this manner, this search is repeatedly performed by incrementing by 1, until the connection distances of the entire chambers are completely obtained. In this example, the calculation of the connection distances is completed, when a connection distance 5 of the transport chamber 216 is obtained.

In step 2104, information regarding the vacuum robot arranged in each transport chamber is extracted from the transferring robot information 114. The connection distance of each transport chamber is set as the connection distance of its corresponding vacuum robot. The transferring robot information 114 represents both the site in which the transferring robot is arranged and the kind of robot. In the example, the vacuum robot arranged in the transport chamber 214 is a vacuum robot 217. The transport chamber 214 has the connection distance 1, while the vacuum robot 217 has the connection distance 1.

Figure 22:
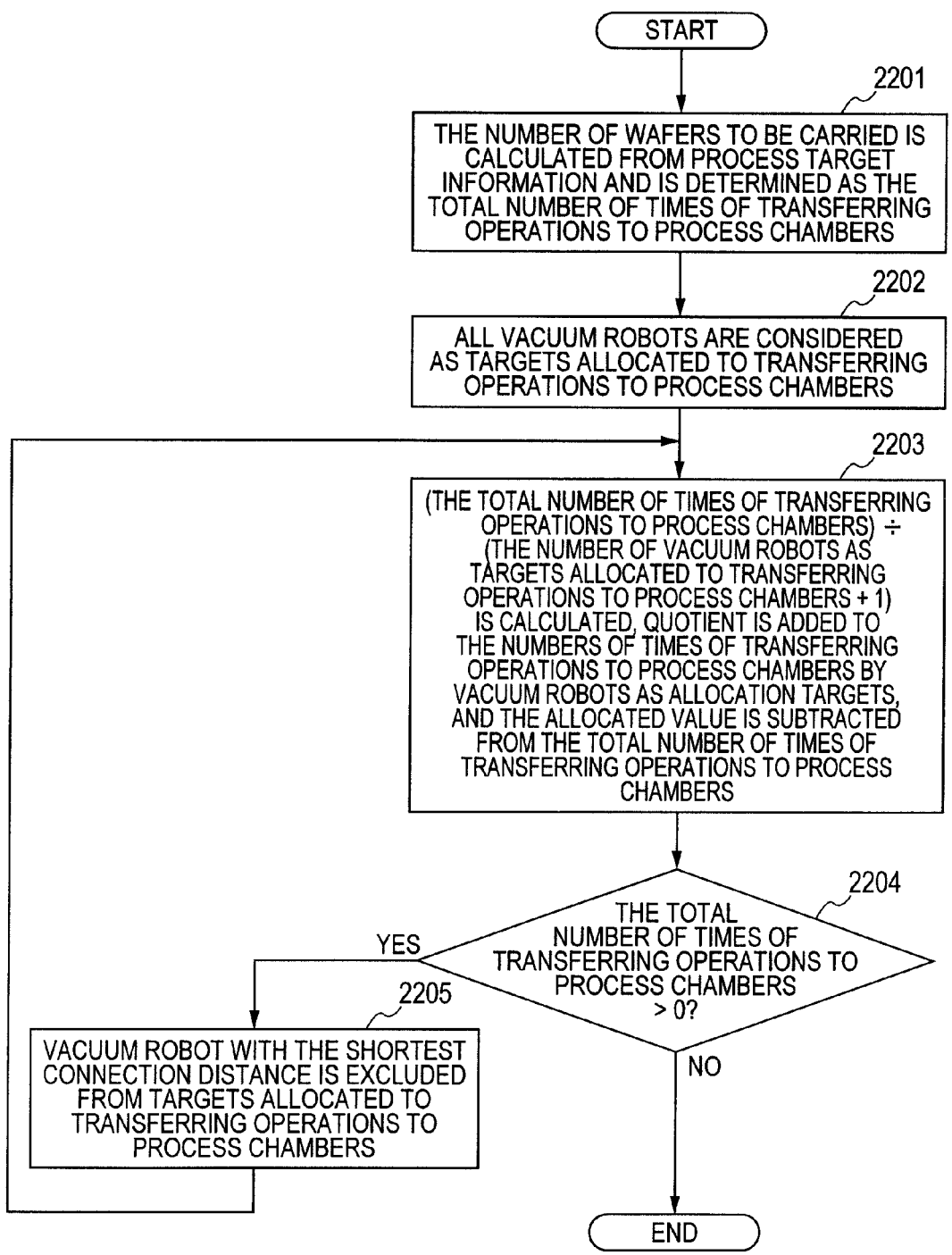
FIG. 22 is a diagram showing a flowchart of a process for calculating the number of times of transferring operations to process chambers.

Descriptions will now be made to the calculation of the number of times of transferring operations to process chambers 502, using the flowchart of FIG. 22. In step 2201, the number of wafers to be processed is counted based on the processing target information 109, and the counted number of wafers is set as the total number of transferring operations to process chamber. In step 2202, in the initial state, the entire vacuum robots can be allocated for the process chamber transferring. In step 2203, obtained first is the quotient of the "total number of transferring operations to process chamber" divided by the "number of vacuum robots to be allocated +1". This quotient is added to each number of transferring operations to process chamber. Then, the number of allocated wafers is subtracted from the total number of transferring operations to process chamber. In step 2204, a determination is made as to whether the subtracted total number of transferring operations to process chamber is greater than 0. If the total number is greater than 0, the flow proceeds to step 2205. If the total number is equal to or smaller than 0, the calculation ends. In step 2205, a predetermined vacuum robot(s) is excluded, and the flow returns to step 2203. In this case, this vacuum robot has the shortest connection distance from a vacuum robot to be allocated for the process chamber transferring.

The process of the calculation 502 of the number of times of transferring operations to process chambers will now exemplarily be described. First, the number of target wafers to be processed is counted based on the processing target information 109, and the total number of transferring operations to the process chamber is calculated. In this case, the total number is 25. Now, the entire vacuum robots 217, 218, and 219 are set as target vacuum robots to be allocated to the process chambers. In this description, the numbers of transferring operations to the process chamber P1, P2, and P3 respectively correspond to the vacuum robots 217, 218, and 219. In an initial state, P1=P2=P3=0.

The quotient, 6, of the total number, 25, of transferring operations to the process chambers divided by 4 (the number of target vacuum robots to be allocated plus 1 is equal to 4, i.e. 3+1=4) is added to P1, P2, and P3. At this point, P1=P2=P3=6. Now, 18 (allocated transferring operations) is subtracted from the total number of transferring operations to the process chambers, resulting in that the total number of transferring operations to the process chambers is 7. In this case, the total number of transferring operations to the process chambers is greater than 0. Thus, of the target vacuum robots to be allocated, the vacuum robot(s) having the shortest connection distance is excluded from the target vacuum robots to be allocated. In connection distance calculation 501, suppose that the vacuum robot 217 has the connection distance 1, the vacuum robot 218 has the connection distance 3, and the vacuum robot 219 has the connection distance 5. In this case, the vacuum robot 217 is excluded from the target vacuum robots to be allocated.

The total number, 7, of transferring operations to the process chamber is allocated to P2 and P3. The total number, 7, of transferring operations to the process chamber is divided by 3 (the number of target vacuum robots to be allocated plus 1 is equal to 3, i.e. 2+1=3). The quotient (2) of the calculation is added to P2 and P3. At this point, P1=6, and P2=P3=8. The total number of transferring operations to the process chamber is 3. In this case, the total number of transferring operations to the process chamber is greater than 0. Of the target vacuum robots to be allocated, the vacuum robot 218 is excluded from the target vacuum robots to be allocated. This is because the vacuum robot 218 has the shortest connection distance. The total number, 3, of transferring operations to the process chamber is added to P3. As a result, P1=6, P2=8, P3=11. In this manner, the calculation is so made that the number of transferring operations to the process chamber increases, as the vacuum robot has a long connection distance from the load lock. Note, however, that the calculation algorithm on the number of transferring operations to the process chamber is only one example. Any other calculation algorithm may be applied as long as there is a large number of transferring operations to the process chamber, as the vacuum robot has a long connection distance from the load lock.

Descriptions will now be made to the transferring operation order calculation 503 using the flowchart of FIG. 23. In step 2301, one vacuum robot is selected from the entire vacuum robots. Information regarding the transport chamber in which the selected vacuum robot is arranged is extracted from the transferring robot information 114. The extracted information corresponding to the "connection site 1" is searched from the site connection information 113, and information regarding all sites corresponding to the "connection site 2" of the searched data are all extracted. In step 2302, the number of transferring operations to the process chamber corresponding to the selected vacuum robot is acquired. In step 2303, a check is made as to whether both of the process chamber(s) and the buffer room(s) correspond to the site extracted in step 2301. If both chambers correspond to the site, the flow proceeds to step 2304. If only either chamber corresponds to the extracted site, or if neither chamber corresponds to the extracted site, the flow proceeds to step 2306.

In step 2304, the total number of transferring operations of a predetermined vacuum robot to the process chamber is obtained. In this case, the predetermined vacuum robot has the longer connection distance than that of the selected vacuum robot. The obtained total number of transferring operations to the process chamber is set as the number of transferring operations of the selected vacuum robot to the buffer room.

In step 2305, a transferring operation order 1 is generated. In this order, the transferring operation(s) of the selected vacuum robot to the process chamber and the transferring operations(s) to the buffer room are alternately executed for the number of times corresponding to either smaller number between the number of transferring operations to the process chamber and the number of transferring operations to the buffer room. Further, a difference is obtained between the number of transferring operations to the process chamber and the number of transferring operations to the buffer process chamber room. The transferring operation, corresponding to either larger number between the number of transferring operations to the process chamber and the number of transferring operations to the buffer room, is continuously performed for the number of times that is equal to the obtained difference. The transferring operation order for the selected vacuum robot is generated, in such a manner that the particular transferring operation is executed after the transferring operation order 1.

In step 2306, based on the site connection information 113, if only a process chamber corresponds to the site searched in step 2301, the transferring operation order of the selected vacuum robot is set as one for the transferring operation to the process chamber. If only a buffer room corresponds to the site searched in step 2301, the transferring operation order of the selected vacuum robot is set as the one for the transferring operation to the buffer room.

In step 2307, a check is made as to whether the transferring operation order has been generated for the entire vacuum robots. If the transferring operation order has been generated for the entire vacuum robots, the flow ends. If the transferring operation order has not been generated for the entire vacuum robots yet, the flow returns to step 2301.

Note that this calculation algorithm on this transferring operation order is only one example. Any other calculation algorithm may be applied as long as an odd number of transferring operations to buffer room can be attained as much as possible.

The process of the transferring operation order calculation 503 will now exemplarily be described. One vacuum robot is selected from the transferring robot information 114, and a transport chamber in which the selected vacuum robot is arranged is searched therefrom. In this description, suppose that the vacuum robot 217 has been selected. In step 2301, the transport chamber having the vacuum robot 217 is the transport chamber 214, as seen from the transferring robot information 114. Thus, data regarding the transport chamber 214 corresponds to the "connection site 1" included in the site connection information 113, and a site(s) of the "connection site 2" corresponding to the searched data is searched. The buffer room 212, the process chambers 205 and 206 are searched. In step 2302, the number of transferring operations of the vacuum robot 217 to process chamber is acquired, since the number "6" has been calculated in the calculation of the number of times of transferring operations to the process chambers 502. In this case, because the site information extracted in step 2301 represents both of the buffer room and the process chamber, the flow proceeds to 2304. As a result of the connection distance calculation 501, the vacuum robots having a larger connection distance than that of the vacuum robot 217 correspond to the vacuum robots 218 and 219. The numbers of transferring operations of the vacuum robots 218 and 219 to process chamber are added together to obtain the sum, 19. Thus, the number of transferring operations of the vacuum robot 217 to buffer room is 19. The transferring operation order 1 is generated based on the smaller number between the number, 6, of transferring operations to process chamber and the number, 19, of transferring operations to buffer room. In this transferring operation order 1, the transferring operations to process chamber and the transferring operations to buffer room are alternately repeated for 6 times. Now, a transferring operation order of the vacuum robot 217 is generated based on the difference between the number, 19, of transferring operations to buffer room and the number, 6, of transferring operations to process chamber. In this transferring operation order, the transferring operations to buffer room are repeated for 13 times, after the transferring operation order obtained in the above process.

Descriptions will now be made to a case in which the vacuum robot 219 is selected. In step 2301, the transport chamber in which the vacuum robot 219 is arranged is the transport chamber 216. Data representing the transport chamber 216 corresponding to the connection site 1 is searched from the site connection information 113. A site(s) of the connection site 2 corresponding to the searched data is extracted therefrom. The process chambers 209 and 210 are searched. In step 2302, the number of transferring operations of the vacuum robot 219 to process chamber is 11, as calculated in the calculation 502 of the number of times of transferring operations to process chambers, and the calculated number is now acquired. Only the process chamber corresponds to the site searched in step 2301, and thus the flow proceeds to step 2306. Because only the process chamber corresponds to the searched site, in the transferring operation order of the vacuum robot 219, the transferring operations to process chamber are repeated. The number, 11, corresponds to the number of transferring operations to process chamber acquired in step 2302.

Figure 24:
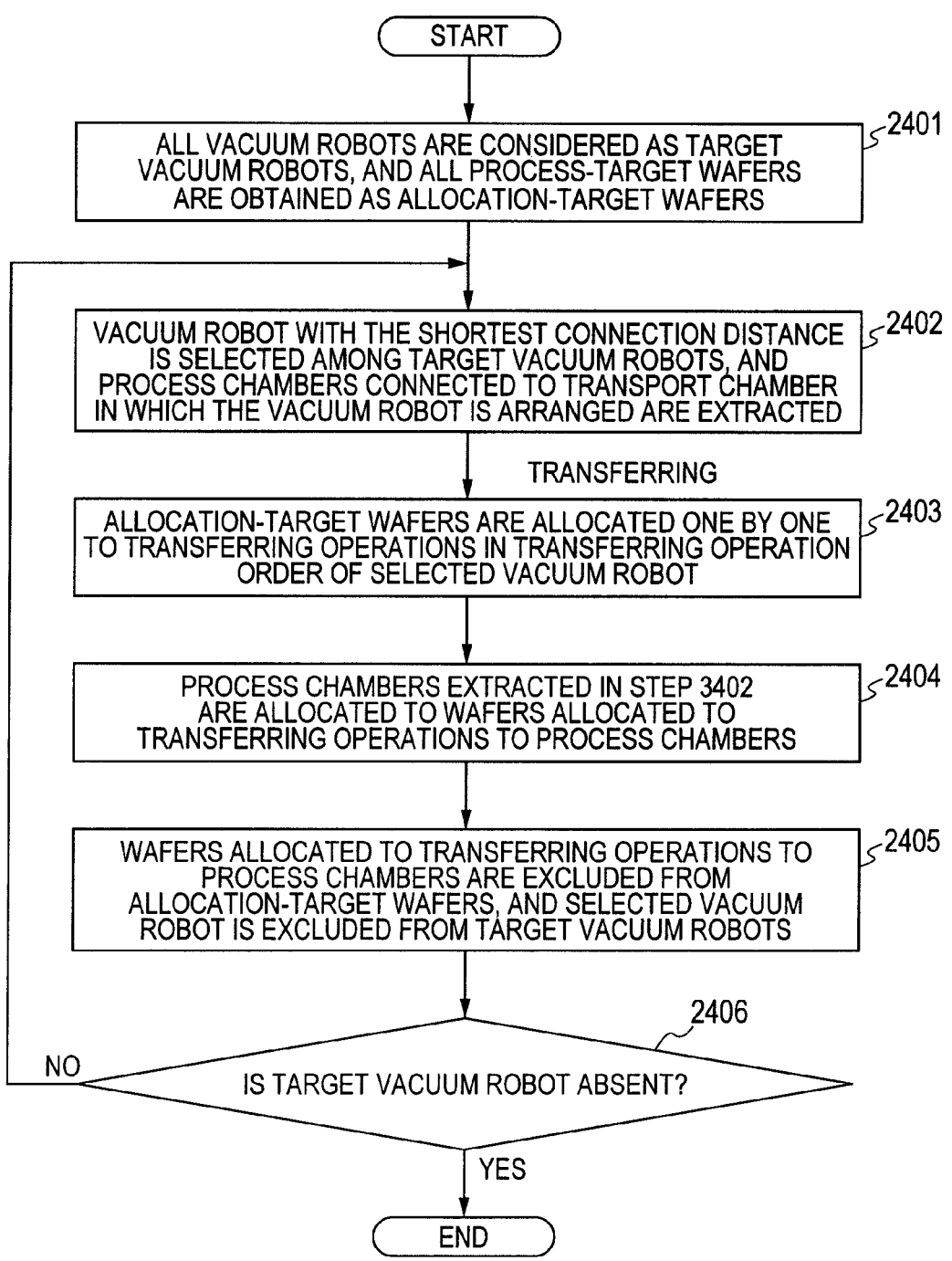
FIG. 24 is a diagram showing a flowchart of a process chamber allocation process.

Descriptions will now be made to the process chamber allocation 504 using the flowchart of FIG. 24. In step 2401, in the initial state, the entire vacuum robots in the transferring robot information 114 are regarded as target vacuum robots. Information regarding the entire target wafers to be processed is extracted from the processing target information 109, and the target wafers are regarded as target wafers to be allocated. In step 2402, a vacuum robot having the shortest connection distance is selected from the target vacuum robots, and information about the transport chamber in which the vacuum robot is arranged is searched from the transferring robot information 114. The site connection information 113 is used for searching for data representing the searched transport chamber corresponding to the connection site 1. Of sites corresponding to the connection site 2 of the searched data, information regarding the process chamber is extracted. In step 2403, a target wafer to be allocated is allocated to each of the transferring operations in the transferring order for the selected vacuum robot. That is, the wafer is allocated to each operation, such as the transferring operation to the process chamber or the transferring operation to the buffer room. In step 2404, the process chamber searched in step 2402 is allocated to the wafer allocated to the transferring operation to the process chamber. At this time, if there are plural process chambers, the wafers are equally allocated to the process chambers. In step 2405, the wafer(s) allocated to the transferring operation to the process chamber is excluded from the target wafers to be allocated, and the selected vacuum robot is excluded from the target vacuum robots. Finally, in step 2406, a check is made as to whether there is the target vacuum robot. If there is no target vacuum robot, the flow ends, while if there is still a target vacuum robot, the flow returns to step 2402.

The process of the process chamber allocation 504 will now exemplarily be described. In the initial state, the entire vacuum robots are target vacuum robots, and the entire target wafers to be processed are target wafers to be allocated. First, a target vacuum robot is selected. As a result of the connection distance calculation 501, the vacuum robot 217 is the one having the shortest connection distance. The transport chamber 214 is the one in which this vacuum robot 217 is arranged. Thus, data representing the transport chamber 214 corresponding to the connection site 1 is searched from site connection information 113. Information regarding the connection site 2 corresponding to the searched data is extracted. Of the extracted sites, the process chamber is extracted. In this example, the process chambers 205 and 206 are extracted.

A target wafer to be allocated is allocated to each transferring operation included in the transferring operation order for the vacuum robot 217. This transferring operation order has been calculated in the transferring operation order calculation 503. In the transferring operation order for the vacuum robot 217, the "transferring operation to process chamber" and the "transferring operation to buffer room" are repeated for 6 times, and then the "transferring operation to buffer room" is repeated for 13 times. In this operation, the target wafers to be allocated W1, W2, ..., W25 are allocated respectively to the transferring operations in order. That is, the wafer W1 is allocated to the "transferring operation to process chamber", the wafer W2 is allocated to the "transferring operation to buffer room", the wafer W3 is allocated to the "transferring operation to process chamber". In this manner, the wafers W1, W3, W5, W7, W9, W11 are allocated to the "transferring operations to process chamber", while the rest of the wafers are allocated to the "transferring operations to buffer room". The process chambers are allocated to those wafers allocated to the "transferring operations to process chamber". In the above step, the process chambers 205 and 206 have been searched, the wafers are equally allocated to the extracted process chambers. As a result, the wafers W1, W5, and W9 are allocated to the process chamber 205, while the wafers W3, W7, and W11 are allocated to the process chamber 206.

The selected vacuum robot 217 is excluded from the target vacuum robots, and the wafers W1, W3, W5, W7, W9, W11 are excluded from the target wafers to be allocated. Now, a check is made as to whether there is any target vacuum robot. Because the vacuum robots 218 and 219 are still the target vacuum robots, the flow returns to step 2402.

Figure 6:
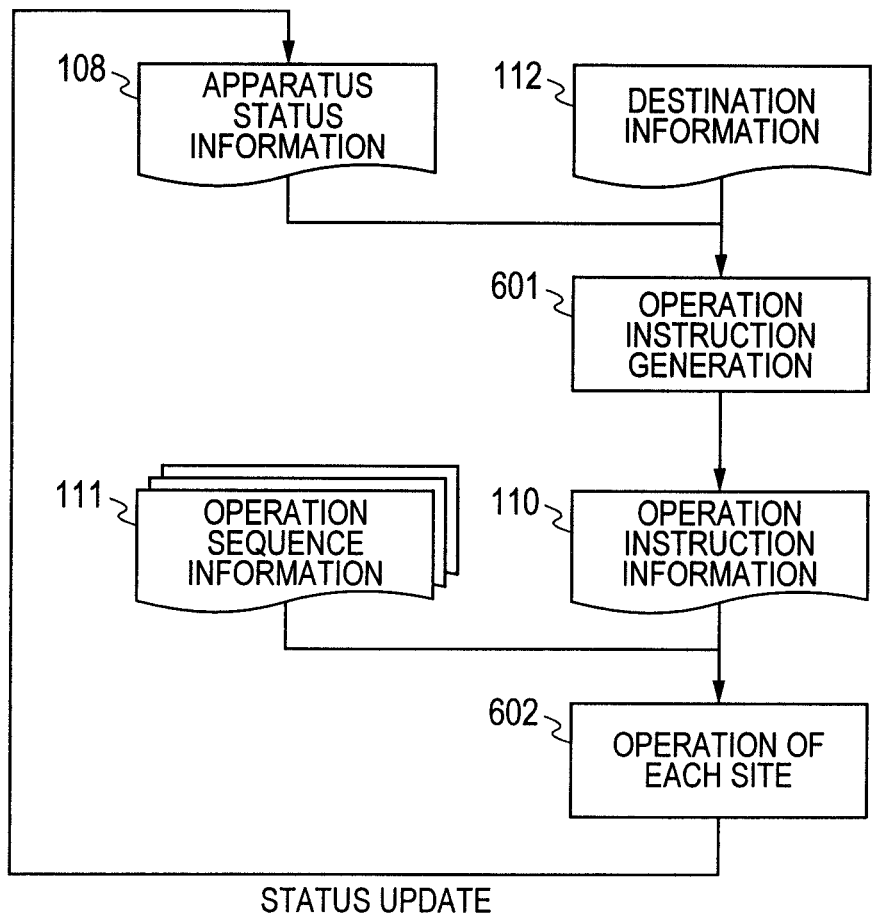
FIG. 6 is a diagram for explaining the scheme of an operation execution process in the first and second embodiments.

Descriptions will now be made to the scheme of the operation execution process 107 using FIG. 6. The operation execution process 107 is provided to actually perform the operation of each site based on operation instruction information. The operation execution process 107 briefly includes two process steps. The first step is an operation instruction generation step 601. In the operation instruction generation step 601, the apparatus status information 108 and the destination information 112 are input, and the operation instruction information 110 is generated. An example of the apparatus status information 108 is shown in FIG. 13. The apparatus status information represents the status of each site, its corresponding wafer number, or status of each process. For example, there is data "site: load lock 221_1; status: vacuum; wafer number: W11; wafer status: unprocessed". This data represents the stage 1 of the wafer keeping mechanism of the load lock 221. The data represents also that: the status of the load lock is "vacuum"; a wafer having a wafer number of "W11" is kept; and the wafer "W11" is an unprocessed wafer. In the operation instruction generation step 601, information is generated based on operation instruction rules, as exemplarily shown in FIG. 7. An operation instruction is generated, when the apparatus status or destination condition is satisfied in accordance with the operation instruction rules.

For example, an operation instruction "transferring from load lock 211 to buffer room 212" is generated in accordance with some conditions. The conditions are: "Unprocessed wafer to be transferred to other than process chambers 205 and 206 is present in load lock 211 and load lock 211 is in vacuum status"; "Available stage is present in buffer room 212"; and "At least one hand of vacuum robot 217 is in standby status". An operation instruction "Hand 1 of vacuum robot 217 carries wafer W10 from stage 1 of load lock 211 to stage 5 of buffer room 212" is generated, in accordance with some conditions. The conditions are: "Unprocessed wafer with wafer number W10 is present in stage 1 of load lock 211"; "destination of wafer W10 is process chamber 207"; "stage 5 is available in buffer room 212"; and "hand 1 of vacuum robot 217 is in standby status". An example of thus generated operation instruction information 110 is shown in FIG. 14. The operation instruction rules exemplarily shown in FIG. 7 are only examples. The operation instruction rules may be prepared in association with all operations.

Descriptions will now be made to a process of operation 602 of each site. In the process of operation 602 of each site, the operation instruction information 110 generated in the operation instruction generation step 601 and the operation sequence information 111 are input, and each site is operated. The operation sequence information 11 is given to show the sequence of the operation performed by each site, in order to execute the generated operation instruction. The operation of each site includes, for example, expanding, contracting, turning around the arm of the vacuum robot, opening/closing the gate valve, and the like. The operation sequence information 111 is exemplarily illustrated in FIG. 16. In this example, provided is operation sequence information for executing an operation instruction for the transferring a target from the load lock 211 to the buffer room 212. The operation is performed in numerical order described as "operation order" in the operation sequence information. At this time, in the case of the same numerical order, the operation is simultaneously performed, and the operation of a described site is performed. For example, when a target is transferred from the load lock 211 to the buffer room 212, the vacuum side gate valve 221 of the load lock 211 is opened. At the same time, the vacuum robot 217 turns around until it faces the load lock 211.

The vacuum robot 217 removes the wafer from the load lock 211. The vacuum robot 217 turns around until it faces the buffer room 212. At the same time, the vacuum side gate valve 221 of the load lock 211 is closed, while the gate valve 224 on the side of the transport chamber 214 of the buffer room 212 is opened. Now, the vacuum robot 217 puts the wafer into the buffer room 212. Finally, the gate valve 224 on the side of the transport chamber 214 of the buffer room 212 is closed. In this manner, the site (each robot or gate valve) is actually operated, based on the operation sequence information. This operation sequence information is prepared in association with each of the entire operation instructions.

Every time the actual operation is performed in the above process, the apparatus status changes. For example, when the hand 1 of the vacuum robot 217 starts turning around, the status of the hand 1 of the vacuum robot 217 changes from "standby" to "transferred". When the robot removes the wafer from the load lock 211, the wafer "W10" is being kept. When the wafer is put into the buffer room 212, the status of the hand 1 of the vacuum robot 217 is changed to "standby", thus attaining the status of "empty". The stage 1 of the load lock 211 keeps the wafer W10. When the vacuum robot 217 removes the wafer, the stage 1 of the load lock 211 does not keep the wafer. Though the stage 5 of the buffer room 212 does not keep the wafer, it is changed to keep the wafer W10, when the vacuum robot 217 puts a wafer thereinto. In this manner, every time a particular operation is performed, the apparatus status information 108 is updated. Every time the apparatus status information 108 is updated, an operation instruction is generated, if a condition(s) is satisfied, by comparing the apparatus status information and the destination information together with the operation instruction rules. This operation execution process is repeated, until no operation instruction is generated.

Figure 12:
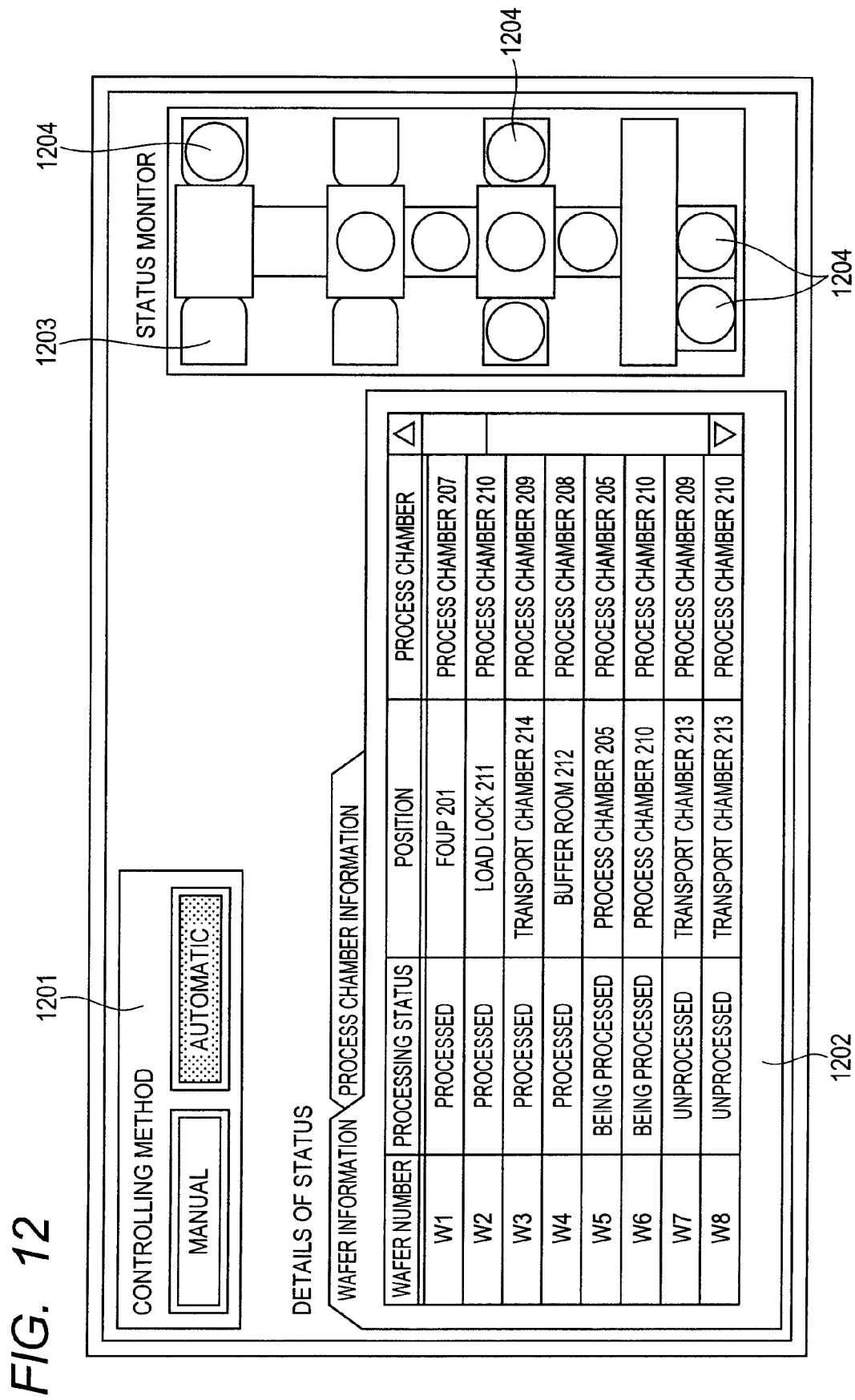
FIG. 12 is a diagram showing an example of a screen of a console terminal.

Finally, descriptions will now be made to a screen of the console terminal 116 using FIG. 12.

The console terminal 116 includes an input unit and an output unit. The input unit includes a keyboard, a mouse, a touch pen, or the like. The output unit includes a screen. The screen includes areas 1201, 1202, 1203. The area 1201 is to select a controlling method. The area 1202 is to display detailed data about the apparatus status. The area 1203 is to display the scheme of the apparatus status. In the area 1201, there are provided buttons "Manual" and "Automatic" for selecting a controlling method. Upon selection or inputting of either button, the selected fact is clearly revealed in the selected button, by changing the color of the selected button, or the like. In the area 1202, displayed is the status detail of wafers 1204 in the apparatus or status details of the process chamber or transferring mechanism. In the area 1203, displayed are information representing the positions of the apparatus and wafers 1204, thus visually representing where and which wafers 1204 are present. As the wafers 1204 move, the displayed position of the wafers 1204 changes in accordance with the movement.

Second Embodiment

Descriptions will now be made to a second embodiment of the present invention.

In the second embodiment, descriptions will be made to an apparatus with the event-driven system as a controlling method. For efficient transferring operations in the apparatus with the event-driven apparatus, it is desirable to calculate the transferring operations such that the odd number of times the transferring operations to buffer room is continuously performed by the robot of each transport chamber as much as possible, and the transferring operations are executed based on the calculation.

The scheme of the entire configuration of the semiconductor processing apparatus is the same as that of the first embodiment which has been described using FIG. 1. Configurations of the process chamber and transferring mechanism are the same as those of the first embodiment described using FIG. 2. The scheme of the system for controlling operations of the semiconductor processing apparatus is the same as that of the first embodiment described using FIG. 3. The scheme of the destination determination process 106 is the same of that of the first embodiment described using FIG. 4.

Figure 8:
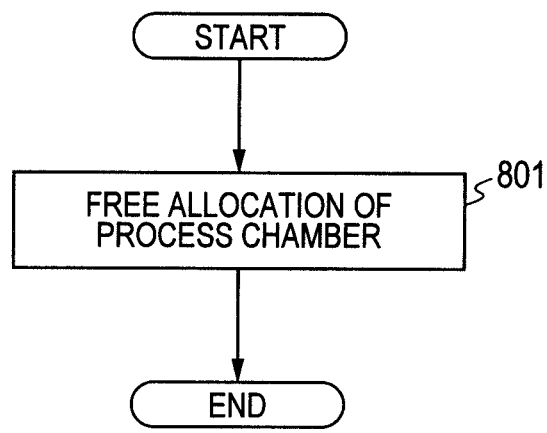
FIG. 8 is a diagram for explaining a calculation procedure for calculating the destination in the second and third embodiments.

Descriptions will now specifically be made to a calculation procedure of the destination calculation 401 in the second embodiment, using FIG. 8. This calculation includes one step of free allocation 801 of process chamber. In the free allocation 801 of process chamber, available process chambers are all allocated to target wafers to be processed. This implies that any of the allocated process chambers can be used. Information regarding all process chambers corresponding to the "connection site 2" are extracted from the site connection information 113. Information regarding all wafers is extracted from the processing target information 109. Based on the extracted information from the site connection information 113, the entire process chambers are allocated to the entire wafers included in the extracted wafer information. The destination information 112 includes data representing "wafer number: W1, destination: process chambers 205, 206, 207, 208, 209, 210". This presents that the wafer W1 can be transferred to any of the process chambers 205, 206, 207, 208, 209, and 210.

Descriptions will now be made to the operation execution process 107 in the second embodiment. Like the first embodiment, the operation execution process 107 is to actually operate each site based on operation instruction information. The process briefly includes two process steps, and has the similar scheme as that of the process described with FIG. 6. In the second embodiment, the operation instruction rules in the operation instruction generation step 601 differ from those of the first embodiment. The operation instruction rules in the second embodiment are exemplarily shown in FIG. 9. The operation instruction rules include a particular rule for attaining that a larger number of times of transferring operations to process chambers are performed in a transport chamber far from the load lock. In order to increase the number of times of transferring operations to the process chambers in a transport chamber far from the load lock, it is desired that the buffer room far from the load lock keep many unprocessed wafers. In order to do this, it is desired to have a predetermined operation instruction rule. According to this rule, the number of unprocessed wafers kept in the load lock or buffer room is counted. Further, when only a small number of unprocessed wafers are kept in a unit far from the load lock, the vacuum robot carries the wafers preferentially to the buffer room rather than the process chamber.

For example, a condition "number of unprocessed wafers in buffer room 212 is larger than that in load lock 211" is added in the operation instruction conditions corresponding to an operation instruction "transferring from load lock 211 to process chamber 205". On the contrary, no condition regarding the number of unprocessed wafers is made in the operation instruction conditions corresponding to an operation instruction "transferring from load lock 211 to buffer room 212". Under such conditions, if the number of unprocessed wafers in the load lock 211 is larger than the number of unprocessed wafers in the buffer room 212, the conditions for transferring the wafers to the process chamber 205 are not satisfied. Thus, no wafer is transferred to the process chamber 205. In this case, the conditions for transferring the wafers to the buffer room 212 are satisfied, the wafers are transferred to the buffer room 212. By setting such operation instruction rules, the farther the buffer room from the load lock, the more unprocessed wafers may be kept. As a result, the farther the transport chamber from the load lock, the more transferring operations to the process chambers may be performed.

The operation instruction rules differ from those of the first embodiment. The calculation for generating the operation instruction 110 is the same as that of the first embodiment. Particularly, the calculation is done by comparing the apparatus status information 108 and the destination information 112 together with the operation instruction rules. The process of operation 602 of each site is the same as that of the first embodiment. The screen of the console terminal is the same as that of the first embodiment.

Third Embodiment

Descriptions will now be made to a third embodiment of the present invention. In the third embodiment, descriptions will be made to an example of an apparatus with an event-driven control system as a controlling system. For efficient transferring in the apparatus having an event-driven system, the transferring operations may be executed in accordance with a controlling rule for transferring wafers preferentially to the transport chamber or buffer room far from the load lock. This may be performed particularly when the number of unprocessed wafers in the transport chamber or buffer room far from the load lock is smaller than the number of unprocessed wafers in the transport chamber or buffer room near the load lock.

The scheme of the entire configuration of the semiconductor processing apparatus is the same as that of the first embodiment described using FIG. 1. The configuration of the process chamber/transferring mechanism is also the same as that of the first embodiment described using FIG. 2. The scheme of the system for controlling operations of the semiconductor processing apparatus is also the same as that of the first embodiment described using FIG. 3. The scheme of the destination determination process 106 is also the same as that of the first embodiment described with FIG. 4.

Descriptions will now specifically be made to a calculation procedure in the destination calculation 401 in the third embodiment. This calculation is the same as that of the second embodiment described using FIG. 8. In this calculation, available process chambers are all allocated to target wafers to be processed.

Figure 10:
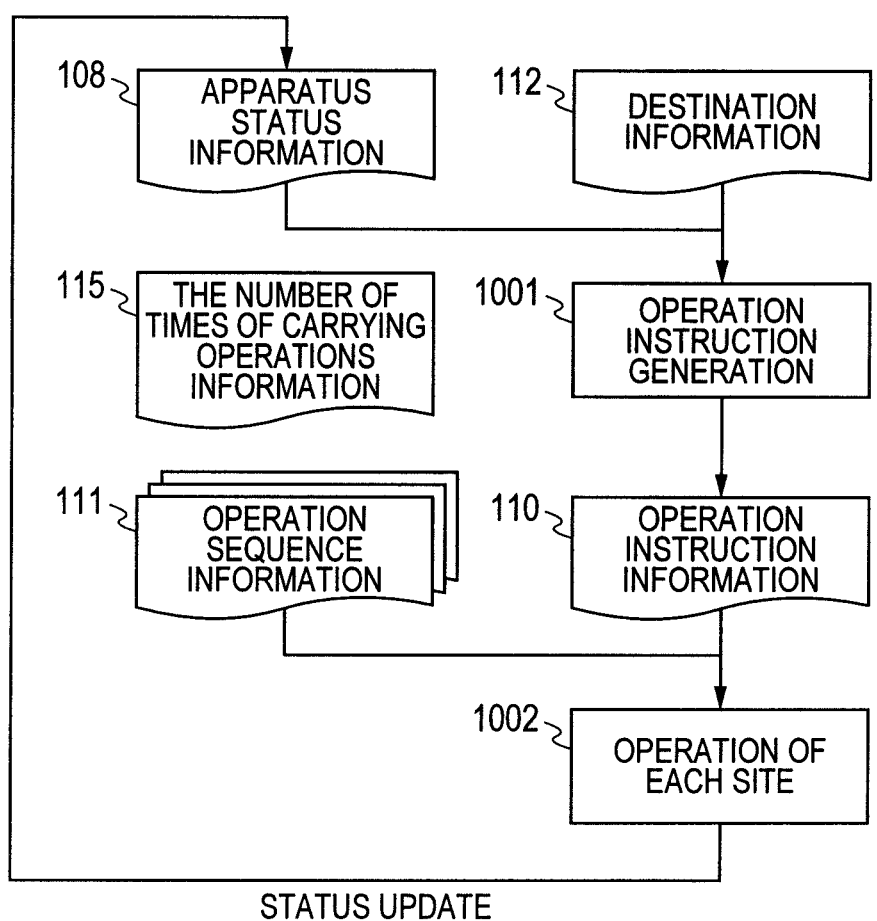
FIG. 10 is a diagram for explaining the scheme of an operation execution process in the third embodiment.

Descriptions will now be made to the scheme of the operation execution process 107 in the third embodiment using FIG. 10. Like the first embodiment, the operation execution process 107 is to actually perform operation of each site based on operation instruction information. The operation execution process briefly includes two process steps, which are an operation instruction generation step 1001 and an operation 1002 of each site. In the operation instruction generation step 1001, the apparatus status information 108, destination information 112, and the number of times of transferring operation information 115 are input, and the operation instruction information 110 is generated. Like the first and second embodiments, in the operation instruction generation step, generation instruction rules are prepared. If the operation instruction conditions are satisfied, an operation instruction is generated, by comparing the generation instruction rules together with the apparatus status information 108, the destination information 112, and the number of times of transferring operation information 115. The characteristic part of the third embodiment is that there is a condition for the number of times of transferring operations, in the operation instruction rules. The number of times of transferring operations includes information exemplarily shown in FIG. 20, and information representing the counted number of times in which each vacuum robot performs the transferring operations to the buffer room. Every time the vacuum robot performs the transferring operation to the buffer room, the number of times of transferring operations is incremented by one in the information representing the number of times of transferring operation. Every time the transferring operation to process chamber is performed, the number of times of transferring operation is reset to "0".

The number of times of transferring operations to the buffer room may be added to the operation instruction rules. It is intended to lower the number of times of transferring operations to the process chamber as much as possible, and to attain an odd number of times of continuous transferring operations to the buffer room as much as possible. In order to achieve this object, there are provided operation instruction rules, as exemplarily shown in FIG. 11. For example, a condition "number of times of transferring operations of vacuum robot 217 to buffer room is odd number" is added to the operation instruction conditions corresponding to an operation instruction "transferring from load lock 211 to process chamber 205". In addition, a condition "even number of times in which vacuum robot 217 performs transferring operations to buffer room" is added to the operation condition corresponding to an operation instruction "transferring from load lock 211 to buffer room 212". Having such conditions, in the transferring operations of the vacuum robot 217, the transferring operation to the process chamber and the transferring operation to the buffer room are alternately performed. The process of operation 1002 of each site is the same as the operation 602 of each site in the first embodiment.

The screen of the console terminal is the same as that of the first embodiment.

It should be understood by those skilled in the art that various modifications, combination, sub-combinations and alterations may occur depending on design requirements and other factors insofar as they are within the scope of the appended claims or the equivalents thereof.

What is claimed is:

1. A vacuum processing apparatus including a load lock that transfers a to-be-processed object arranged on an atmosphere side onto a vacuum side, the apparatus comprising:
a plurality of process chambers that perform a predetermined process for the to-be-processed object;
a plurality of transferring mechanism units each of which include a vacuum robot receiving and passing the to-be-processed object;
a plurality of transferring intermediate units that connect the transferring mechanism units, and relays and carries the to-be-processed object; and
a control unit that controls receiving/passing and relaying/transferring of the to-be-processed object, and wherein the control unit includes
a connection distance calculation unit that calculates a connection distance from the load lock to each of the transferring mechanism units,
a transferring operation count calculation unit that calculates number of times of transferring operations of the to-be-processed object to each of the plurality of process chambers connected to the vacuum robot,
a transferring operation order calculation unit that calculates a transferring operation order for the to-be-processed object in the vacuum robot, based on the number of times of transferring operations, to each of the plurality of process chambers and each of the plurality of transferring intermediate units, performed by the vacuum robots, and
a process chamber allocation unit that allocates each of the plurality of process chambers to which the to-be-processed object corresponding to the transferring operation order calculated by said transferring operation order is transferred.

2. The vacuum processing apparatus according to claim 1, wherein
when the transferring mechanism units are connected with each other though the plurality of transferring intermediate units, if a connection distance of one of the transferring mechanism units that is calculated by the connection distance calculation unit is set as a first connection distance, and if a connection distance of another one of the transferring mechanism units that is longer than the first connection distance is set as a second connection distance,
the control unit calculates, for each of the transferring mechanism units, number of times of transferring operations of the to-be-processed object to the process chambers connected to the transferring mechanism units having the second connection distance, in such a manner that the number of times of transferring operations is greater than number of times of transferring operations to the process chambers connected to the transferring mechanism units having the first connection distance, and carries the to-be-processed object to the process chambers based on a result of the calculation.

3. The vacuum processing apparatus according to claim 1, wherein
the connection distance calculation unit searches for a site having a connection distance "n" from the load lock, based on connection information representing a connection status of sites included in the vacuum processing apparatus, and
at least one of the plurality of transferring mechanism units that has been searched in the search is set as a transferring mechanism unit having the connection distance "n".

4. The vacuum processing apparatus according to claim 1, wherein
the control unit
lowers number of times of transferring operations of the vacuum robot, for continuously transferring the to-be-processed object to at least one of the plurality of the process chambers as much as possible, using the transferring operation order calculation unit,
calculates a transferring order in such a manner that number of times of continuous transferring operations to at least one of the transferring intermediate units is an odd number, and
determines a destination of the to-be-processed object using the process chamber allocation unit.

5. The vacuum processing apparatus according to claim 1, wherein
the control unit compares number of unprocessed to-be-processed objects kept by the load lock and number of unprocessed to-be-processed objects kept in at least one of the plurality of transferring mechanism units connected to the load lock and at least one of the plurality of transferring intermediate units connected to the transferring mechanism unit, and
if only a small number of unprocessed to-be-processed objects are kept in the at least one transferring intermediate unit, the control unit carries at least one unprocessed to-be-processed object preferentially to the transferring intermediate unit.

6. The vacuum processing apparatus according to claim 1, wherein
the control unit carries the to-be-processed object preferentially to the at least one process chamber, when an odd number of continuous transferring operations of the vacuum robot is performed for continuously transferring the to-be-processed objects to the transferring intermediate unit, and
when an even number of continuous transferring operation of the vacuum robot is performed for continuously transferring the to-be-processed object to the transferring intermediate unit, the control unit carries unprocessed to-be-processed objects to the transferring intermediate unit.

7. The vacuum processing apparatus according to claim 5, wherein
the control unit
compares number of unprocessed to-be-processed objects kept in the load lock and number of unprocessed to-be-processed objects kept in at least one transferring mechanism unit connected to the load lock and the transferring intermediate unit connected to the transferring mechanism unit, and
carries the unprocessed to-be-processed objects preferentially to the transferring intermediate unit, when not a small number of unprocessed to-be-processed objects are kept in the transferring intermediate unit, and when an even number of times of continuous transferring operations of the vacuum robot is continuously performed for transferring the to-be-processed objects.

8. The program readable by a calculation processing apparatus, the storage medium storing a program of instructions executable by the calculation processing apparatus to function as:
a unit that transfers to-be-processed objects arranged on an atmosphere side to a vacuum side through a load lock;
a plurality of processing units each of which performs a predetermined process for the to-be-processed objects in a process chamber;
a plurality of transferring units each of which receive and passes the to-be-processed objects using a vacuum robot;
a plurality of transferring intermediate units each of which connects the transferring units, relays and carries the to-be-processed objects;
a connection distance calculation unit that calculates a connection distance from the load lock to each of the plurality of transferring units;
a process chamber transferring count calculation unit that calculates number of times of transferring operations for transferring the to-be-processed objects to the process chamber connected to the vacuum robot;
a transferring operation order calculation unit that calculates a transferring operation order for transferring the to-be-processed object in each vacuum robot, based on number of times of transferring operations of the vacuum robot to the process chamber and the transferring intermediate unit; and
a process chamber allocation unit that allocates the process chamber to which the to-be-processed object, whose transferring operation order has been calculated, is transferred.

* * * * *